(12) United States Patent  
Bickford et al.

(10) Patent No.: US 9,157,956 B2
(45) Date of Patent: Oct. 13, 2015

(54) ADAPTIVE POWER CONTROL USING TIMING CANONICALS

(75) Inventors: Jeanne P. Bickford, Essex Junction, VT (US); Eric A. Foreman, Faifax, VT (US); Peter A. Habitz, Hinesburg, VT (US); Jeffrey G. Hemmett, Bolton Valley, VT (US); Clarence R. Ogilvie, Huntington, VT (US); Tad J. Wilder, South Hero, VT (US); Vladimir Zolotov, Putnam Valley, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 623 days.

(21) Appl. No.: 13/614,564

(22) Filed: Sep. 13, 2012

(65) Prior Publication Data

US 2014/0074422 A1 Mar. 13, 2014

(51) Int. Cl.
  *G06F 17/50* (2006.01)
  *G01R 31/317* (2006.01)
  *G01R 31/30* (2006.01)

(52) U.S. Cl.
  CPC ...... *G01R 31/31718* (2013.01); *G01R 31/3008* (2013.01)

(58) Field of Classification Search
  CPC ............ G06F 17/5045; G06F 2217/78; G06F 2217/84
  USPC .......... 716/100, 106, 108–109, 132–134, 136
  See application file for complete search history.

(56) References Cited

U.S. PATENT DOCUMENTS

| | | |
|---|---|---|
| 7,174,523 B2 | 2/2007 | Engel et al. |
| 7,240,304 B2 | 7/2007 | Dutta et al. |
| 7,475,366 B2 | 1/2009 | Kuemerle et al. |
| 7,620,921 B2 | 11/2009 | Foreman et al. |
| 8,543,960 B1 * | 9/2013 | Bickford et al. ............. 716/132 |
| 2007/0016833 A1 | 1/2007 | Lin |
| 2008/0034337 A1 | 2/2008 | Kuemerle et al. |
| 2009/0115468 A1 | 5/2009 | Berthold et al. |
| 2009/0228843 A1 | 9/2009 | Anemikos et al. |
| 2011/0181337 A1 | 7/2011 | Otsuga et al. |

FOREIGN PATENT DOCUMENTS

WO 2008134215 A1 11/2008

* cited by examiner

*Primary Examiner* — Paul Dinh
(74) *Attorney, Agent, or Firm* — Gibb & Riley, LLC; Anthony Canale

(57) ABSTRACT

A plurality of digital circuits are manufactured from an identical circuit design. A power controller is operatively connected to the digital circuits, and a non-transitory storage medium is operatively connected to the power controller. The digital circuits are classified into different voltage bins, and each of the voltage bins has a current leakage limit. Each of the digital circuits has been previously tested to operate within a corresponding current leakage limit of a corresponding voltage bin into which each of the digital circuits has been classified. The non-transitory storage medium stores boundaries of the voltage bins as speed-binning test data. The power controller controls power-supply signals applied differently for each of the digital circuits based on which bin each of the digital circuit has been classified and the speed-binning test data.

24 Claims, 19 Drawing Sheets

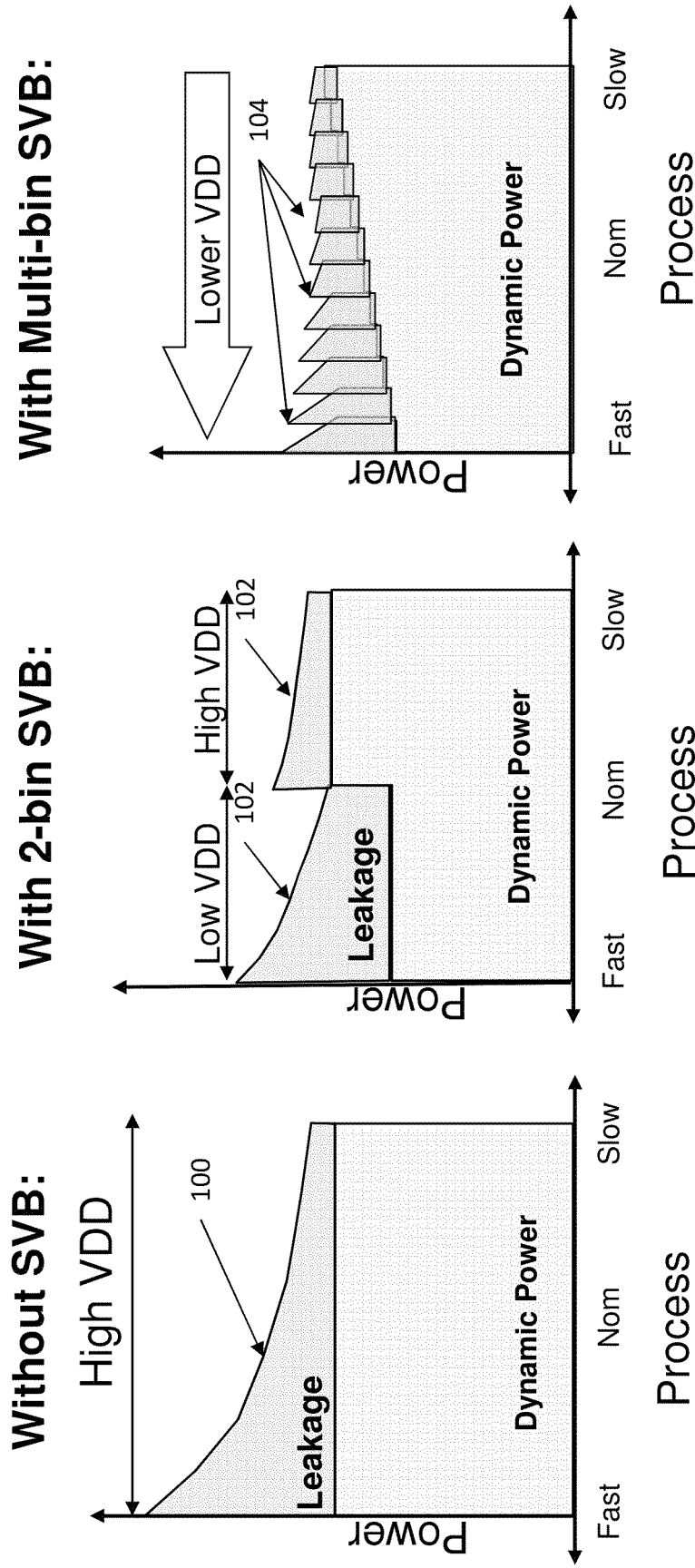

ADAPTIVE POWER CONTROL USING TIMING CANONICALS

BACKGROUND

The embodiments of the invention generally relate to optimizing power usage in integrated circuit designs and more particularly to methods and designs that determine the operating speed of each of the integrated circuit devices based on delay parameters that are applied to a canonical equation that evaluates the different threshold voltage portions of each of the integrated circuit devices differently to sort integrated circuit devices into voltage bins.

Manufacturing variations may cause one or more parameters to vary between integrated circuits that are formed according to the same design. These variations can affect chip operating frequency (i.e., switching speed). For example, due to variations in the equipment, operators, position on a wafer, etc., a specific parameter may vary between chips built on the same wafer, chips built on different wafers in the same lot and/or on chips built on different wafers in different lots. If this parameter is, for example, channel length, width or threshold voltages of the transistors of each chip may be different such that the performance varies (e.g., faster or slower). Chips that are fabricated either at the "slow" end or the "fast" end of a process distribution (e.g., a process-voltage-temperature-variation (PVT) space) may not be desirable. For example, chips that are fabricated at the "slow" end of such a process distribution may not meet the desired performance specification (i.e., may not have a fast enough switching speed), whereas chips fabricated at the "fast" end of this process distribution may exhibit excessive power and leakage current. Thus, it is possible to run faster parts at lower voltage and slower parts at higher voltage, in order to reduce the maximum power for the distribution of parts. The division between the fast and slow portions of the distribution (i.e., the cutpoint), is generally determined apriori during the design phase.

SUMMARY

According to one embodiment herein, a method of optimizing power usage in an integrated circuit design manufactures integrated circuit devices according to the same integrated circuit design, using manufacturing equipment. The integrated circuit design produces integrated circuit devices that are identically designed and are produced in what is intended to be the same manufacturing process, yet some perform at different operating speeds because of unintended or physically uncontrollable manufacturing process variations. The relatively fast integrated circuit devices meet performance requirements at a lower voltage. The relatively slow integrated circuit devices use higher voltages.

Many portions of the integrated circuit devices can operate at different threshold voltages, and for convenience these are sometimes referred to herein as different threshold voltage portions. This method determines the operating speed of each of the integrated circuit devices based on delay parameters that are applied to a canonical equation that evaluates the different threshold voltage portions of each of the integrated circuit devices differently.

This method also sorts the integrated circuit devices after manufacture into relatively slow integrated circuit devices and relatively fast integrated circuit devices based on the operating speed of each of the integrated circuit devices to classify the integrated circuit devices into different voltage bins. The relatively fast integrated circuit devices consume more power than the relatively slow integrated circuit devices and, therefore, operating voltages of the integrated circuit devices can be altered according to the voltage bins to optimize power usage. Thus, this method can embed voltage bin information in each of the integrated circuit devices based on which of the different voltage bins each of the integrated circuit devices has been classified. The voltage bin information can be used to control the operating voltage at which each of the integrated circuit devices are to be operated.

According to another embodiment herein, a method of optimizing power usage in an integrated circuit design manufactures integrated circuit devices according to the same integrated circuit design, using manufacturing equipment. The integrated circuit design again produces integrated circuit devices that are identically designed and are produced in what is intended to be the same manufacturing process, yet some perform at different operating speeds because of unintended or physically uncontrollable manufacturing process variations. The relatively fast integrated circuit devices meet performance requirements at a lower voltage. The relatively slow integrated circuit devices use higher voltages.

Many portions of the integrated circuit devices can operate at different threshold voltages, and for convenience these are sometimes referred to herein as different threshold voltage portions. This method determines the operating speed of each of the integrated circuit devices based on delay parameters that are applied to a canonical equation that evaluates the different threshold voltage portions of each of the integrated circuit devices differently. The canonical equation can be customized for each of the integrated circuit devices based on ranges of the delay parameters.

The method can determine the operating speed of each of the integrated circuit devices by obtaining data from at least one ring oscillator positioned within each of the different threshold voltage portions. Thus, the determination of the operating speed of each of the integrated circuit devices includes determining across chip variations (ACV) of the delay parameters. Further, the determination of the operating speed of each of the integrated circuit devices can be made: by examination of theoretical control paths (TCP); using a yield equation to find voltages that produce zero timing slack within each of the integrated circuit devices; using multiple controlling canonical slack equations that weigh performance against voltage to produce non-linear delay measures, etc.

This method also sorts the integrated circuit devices after manufacture into relatively slow integrated circuit devices and relatively fast integrated circuit devices based on the operating speed of each of the integrated circuit devices to classify the integrated circuit devices into different voltage bins. The relatively fast integrated circuit devices consume more power than the relatively slow integrated circuit devices and, therefore, operating voltages of the integrated circuit devices can be altered according to the voltage bins to optimize power usage. Thus, this method can embed voltage bin information in each of the integrated circuit devices based on which of the different voltage bins each of the integrated circuit devices has been classified. The voltage bin information can be used to control the operating voltage at which each of the integrated circuit devices are to be operated.

A testing system herein can include, for example, a support having a plurality of integrated circuit devices mounted thereon. The integrated circuit devices again are all manufactured from an identical circuit design, but some integrated circuit devices perform at different operating speeds based on unintended or physically uncontrollable manufacturing process variations. The relatively fast integrated circuit devices meet performance requirements at a lower voltage. The relatively slow integrated circuit devices use higher voltages.

A test device is operatively (directly or indirectly) connected to the integrated circuit devices through the support. Also, a non-transitory storage medium is operatively connected to the test device. The test device performs testing according to instructions stored in the non-transitory storage medium.

The instructions causing the test device to perform a method that determines an operating speed of each of the integrated circuit devices based on delay parameters applied to a canonical equation that evaluates different threshold voltage portions of each of the integrated circuit devices differently. Again, each of the different threshold voltage portions of the integrated circuit devices operating at different threshold voltages. The instructions further cause the test device to sort the integrated circuit devices after manufacture into relatively slow integrated circuit devices and relatively fast integrated circuit devices based on the operating speed of each of the integrated circuit devices, to classify the integrated circuit devices into different voltage bins. The relatively fast integrated circuit devices again consume more power than the relatively slow integrated circuit devices. The instructions also cause the test device to embed voltage bin information in the integrated circuit devices based on which of the different voltage bins each of the integrated circuit devices has been classified. The voltage bin information controls the operating voltage at which each of the integrated circuit devices are to be operated.

BRIEF DESCRIPTION OF THE DRAWINGS

The embodiments herein will be better understood from the following detailed description with reference to the drawings, which are not necessarily drawn to scale and in which:

FIG. 1 is a chart illustrating the relationship between process speed and power usage for integrated circuits manufactured with the same process;

FIG. 2 is a chart illustrating the relationship between process speed and power usage for integrated circuits manufactured with the same process using a 2-bin selective binning process;

FIG. 3 is a chart illustrating the relationship between process speed and power usage for integrated circuits manufactured with the same process using a multi-bin selective binning process;

DETAILED DESCRIPTION

Figure 4:
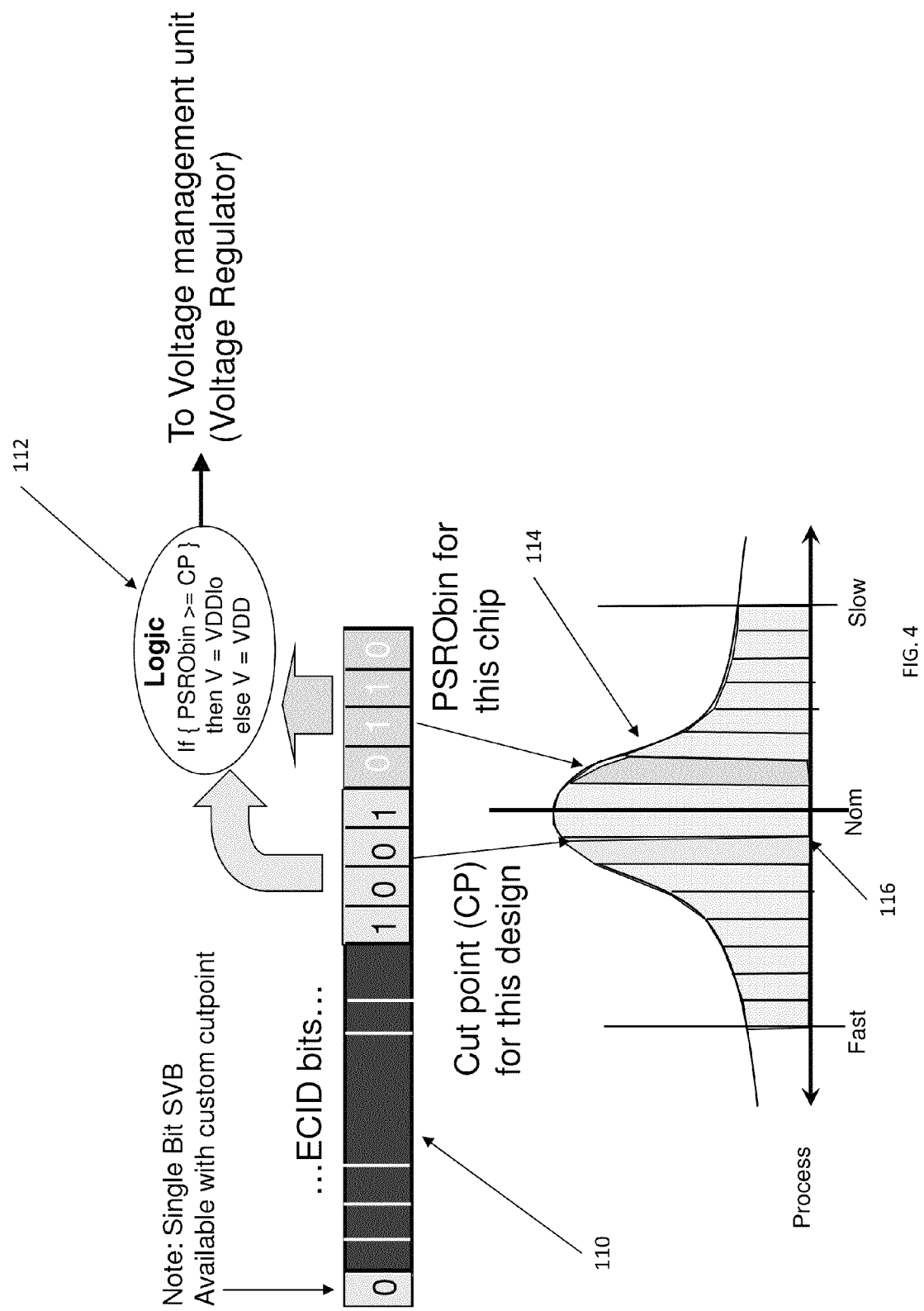
FIG. 4 is a chart illustrating the cut points of selective voltage binning.

As mentioned above, the process of selective voltage binning can run faster parts at lower voltage and slower parts at higher voltage, in order to reduce the maximum power for the distribution of parts. However, conventional selective voltage binning assumes a certain non-changing performance/current leakage relationship, which may not always be correct. Indeed, some large variation in current leakage can occur. Because of this, customers are often advised that the binned devices may not precisely operate within their specific bin classification and, instead, each is provided with a +/−bin variation range (e.g., +/−n bins). The embodiments described below address this issue and are able to supply binned devices that are guaranteed to operate within their specific voltage bin (without requiring a bin variation range).

More specifically, the technology and design system development herein identifies a bounding performance versus current leakage curve and integrates such a curve into the power estimation tool. During product design, the embodiments herein use the power estimation tool (with the bounding current leakage limit) to calculate current leakage for each bin at customer use conditions, calculate the total power for each bin at customer use conditions, and calculate leakage for each bin at test conditions. During product testing, performance is measured, the leakage screen for performance is applied and any noncompliant product is scrapped or classified as nonconforming. This provides lower system power consumption without requiring a bin variation range because the leakage power is guaranteed by the current leakage screening process. This avoids "escapes" and possible system "meltdown."

FIG. 1 is a chart illustrating the relationship between process speed and power usage for identically manufactured integrated circuit devices. FIG. 2 is a chart illustrating the relationship between process speed and power usage for integrated circuits manufactured with the same process using a 2-bin selective binning process, and FIG. 3 is a chart illustrating the relationship between process speed and power usage for integrated circuits manufactured with the same process using a multi-bin selective binning process.

Post-manufacturing voltage binning is a technique that is used to sort manufactured chips into bins based on whether they were fabricated at either the "slow" end or the "fast" end of a process distribution, and to vary the voltage requirements for the chips depending upon the bins they are assigned to in order to reduce maximum chip power. For example, FIG. 1 is a diagram illustrating the dynamic power and process speed for chips that are manufactured from a common design, but that are different because of different processing conditions that occur within acceptable manufacturing tolerances.

In FIG. 1, the worst-case process ranges on curve 100 drives the required voltage for ultimately running the chip, creating an unnecessarily high operating voltage. However, with selective voltage binning shown in FIGS. 2 and 3, every chip is tested to measure operating speed and the chips are sorted into voltage bins accordingly. This reduces maximum chip power by running fast process chips at lower Vdd, as shown by curves 102 and 104. Thus, the devices are binned by process, and slow chips are operated at normal Vdd without change to slow-corner voltage, timing, and power (because slow-corner power is not limiting). However, as shown in FIGS. 2-3, fast chips are operated at reduced Vdd because the fast chips have speed to spare, and at reduced Vdd, power is reduced.

For example, in a process-voltage-temperature space, the temperature and voltage of the chip may be fixed and the leakage may be measured. If the leakage is above a specific cut point, then the chip is on the fast end of the process-voltage-temperature space and placed in a fast chip bin. If the leakage is below the cut point, then the chip is on the slow end of the process-voltage-temperature space and placed in a slow chip bin. After the chips are sorted into bins according to the cut point, an optimal supply voltage (Vdd) for operating the chips in each bin is determined. Since both dynamic power consumption and static power consumption are exponentially proportional to the Vdd, a reduction in the required Vdd will reduce both dynamic and leakage power consumption and, thus, overall power consumption.

In FIG. 4, item 116 represents the selective voltage binning (SVB) cut point between what is considered to be a fast device and what is considered to be a slow device along curve 114. The fast devices will sorted into the "fast" bin and will be utilized at lower voltages than the slow devices that are sorted into the "slow" bin. Because the fast devices have more leakage, the fast devices will consume more power.

In FIG. 4, item 110 represents the electronic chip identification data (ECID) that will be stored on the chip. Thus, the ECID value is burned into the device based on process, the customer reads the ECID (which can be tied to an input/output (IO)) to determine voltage levels on board, and the customer handles setting power supplies differently based upon ECID value. Further, timing closure runs are adjusted for SVB. Thus, item 110 defines the "performance sorting ring oscillator" (PSRO)) and current leakage criteria for a particular bin on each part. Part of this information includes the identification of the cut point use by logic 112 to supply information to the voltage management unit (voltage regulator). As shown in FIG. 4 the logic 112 can alter the voltage at which the specific device operates.

The systems and methods herein use multiple threshold voltage (Vt) PSRO data and other parameter data to disposition parts. This tracks well for all paths, uses multi-Vt paths, including paths with substantial wire delay, and a margin is only required for statistical across chip variation.

Figure 5:
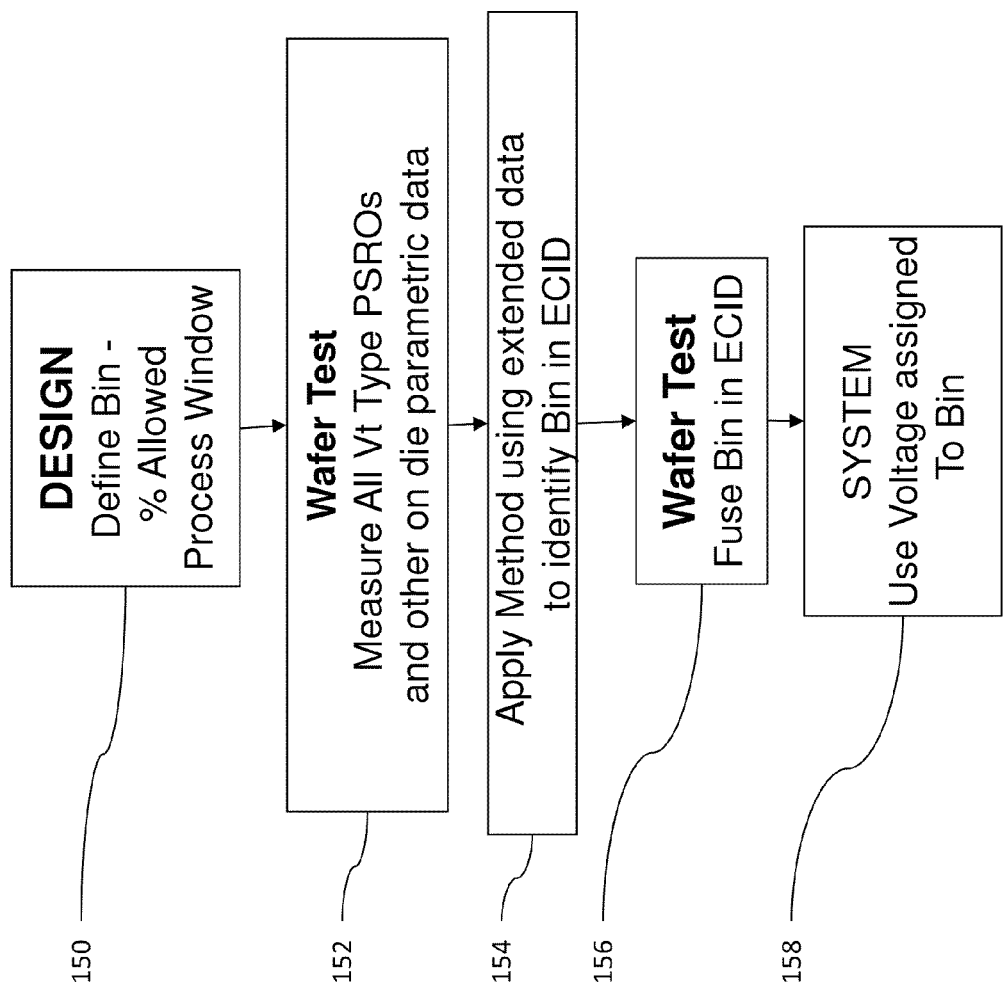
FIG. 5 is a flow diagram illustrating a process of using different threshold voltage measures within a selective voltage binning operation.

FIG. 5 is a box diagram illustrating the overall logical operation of the various methods and devices herein. In item 150, during the process of designing the integrated circuit devices various goals are established including the number of voltage bins, the allowed process window percentage, etc. In item 152, during wafer testing, the systems and methods herein measure all threshold voltage type performance sorting ring oscillators and other die parametric data. In item 154, the systems and methods herein use extended data to identify the bin in ECID. In item 156, during wafer testing, the systems and methods herein fuse bin in ECID. In item 158, the systems and methods herein use voltage assigned to the bin.

In the systems and methods herein, the design work comprises bin definition, determining the number of bins, dividing +/−n sigma distribution into bins, defining the max/min voltages for each bin, and timing closure. Each bin must be covered for its min/max sigma value at its min/max voltage.

With respect to performance and parametric measurement, the systems and methods herein gather data from individual parts, determine mean PSRO data for each Vt type, and determine delta PSRO for systematic ACV. The systems and methods herein wire information for each level from kerf or on chip monitor. N/P mismatch (SPM macro) and information for any measurable process parameter are also performed.

The systems and methods herein analyze data for canonical parameter determination (delay on die, not just oscillator delay). All delay parameters in the canonical equation can be determined through measurement. The systems and methods herein assume min/max for non-measurable parameters (margin).

Further, the methods and systems herein back-annotate to canonical equation (s) that are model specific to an individual device. The systems and methods herein create a chip specific canonical model. These methods are therefore substantially less pessimistic than full process canonical equations. A margin still exists for random ACV and non-measured parameters. The systems and methods herein solve for specific part operating voltage and bin and burn in the ECID a voltage bin or specific voltage value. The systems herein also read ECID and apply the required voltage.

There are many methods to identify the operating voltage. A first method is referred to herein as the Theoretical Control Path Method. In this method, the SVB voltage is calculated for individual parts through examination of six theoretical control paths (TCP). This includes multi-Vt, with and without wire delay (dominate paths). This method back annotates chip data (PSRO, Wire, etc.) and computes the specific chip voltage required at the tester for fuse-blow. This method covers logic paths well and covers arrays with fewer margins.

A second method is referred to herein as the Yield Canonical Equation Method. In this method, the SVB voltage is calculated for individual parts through examination of a single Yield Canonical Equation. This method uses the yield equation to find which voltage produces zero slack (a yield equation rejects chips that have negative slack). This method also back annotates chip data (PSRO, Wire, etc.). The comprehensive parameter coverage (matches timing parameters) includes multiple Vt, n-pmis (n to P mistracking), wire information, ACV, etc. This method similarly computes specific chip voltage required at tester for Fuse-blow. This method also covers logic paths well, and cover arrays to the extent arrays are parameterized by designers.

A third method is referred to herein as the Controlling Canonical Slack Method. In this method, the SVB voltage is calculated for individual parts through examination of six Controlling Canonical Slack Equations. This weights performance against voltage, which is non-linear, while the yield equation is liner. This method has the same capabilities of the Yield Canonical Yield Equation Method, but has the potential to save additional power, through reduced pessimism. This method is an improvement upon TCP, because not all TCP may exist in a design. This method is also an improvement upon the yield canonical method because a straight line yield approximation is less accurate than a piece wise linear approximation of the controlling canonical slacks.

Current SVB methods that concentrate on only one threshold voltage (Vt) type require a margin to mitigate risk, false rejects, and false accepts. The systems and methods herein achieve lower voltage and lower power with the use of multiple Vt types, and more accurate modeling. This guarantees functionality with less margins and fixes the problem of exposure to false rejects/accepts.

Figure 7:
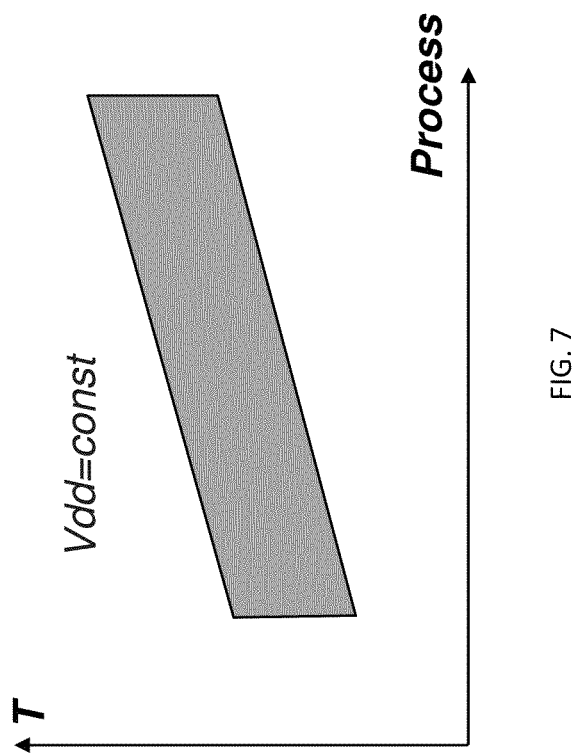
FIG. 7 is a schematic diagram illustrating PSRO characterization.
Figure 6:
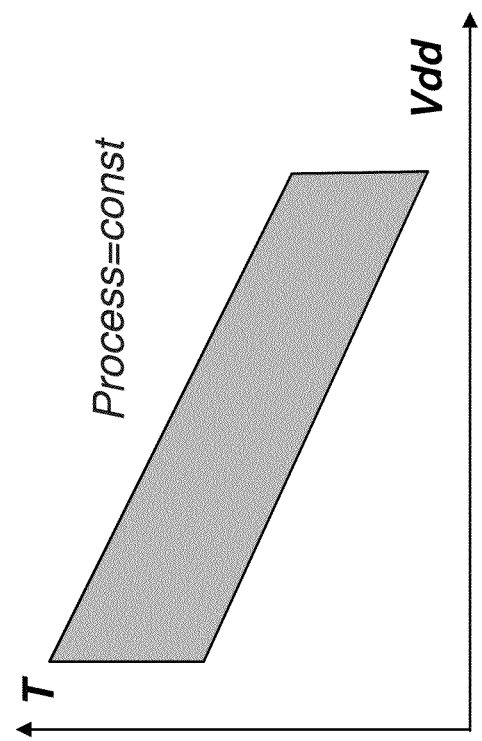
FIG. 6 is a schematic diagram illustrating PSRO characterization.

FIGS. 6 and 7 illustrate PSRO characterization according to methods and systems herein. The systems and methods herein assume PSRO period is characterized as:

$$T_{RO}=T_0+a_{RO,V}\Delta V+a_{RO,Pr}\Delta X_{Pr}+\Delta R$$

In the above equation, the variable $T_{RO}$ represents the oscillation period of the PSRO, the variable $T_0$ represents the mean value of the oscillation period, the variable $\Delta V$ represents the deviation of the supply voltage from its nominal value, the variable $a_{RO,V}$ represents the sensitivity of the oscillation period to the variation of the supply voltage, the variable $\Delta X_{Pr}$ represents the deviation of the process variable from its nominal value, the variable $a_{RO,Pr}$ represents the sensitivity of the oscillation period to the process variation, the variable $\Delta R$ represents the variability of the oscillation period due to the other sources of variation like temperature, interconnect metal, across chip variation, uncorrelated random variation, etc.

More specifically, as shown in FIG. 6 if the process speed is held constant, the operating voltage (Vdd) decreases as the PSRO period (T) decreases. As shown in FIG. 7, if the operating voltage is held constant, as the PSRO period T increases, the process speed increases.

Figure 9:
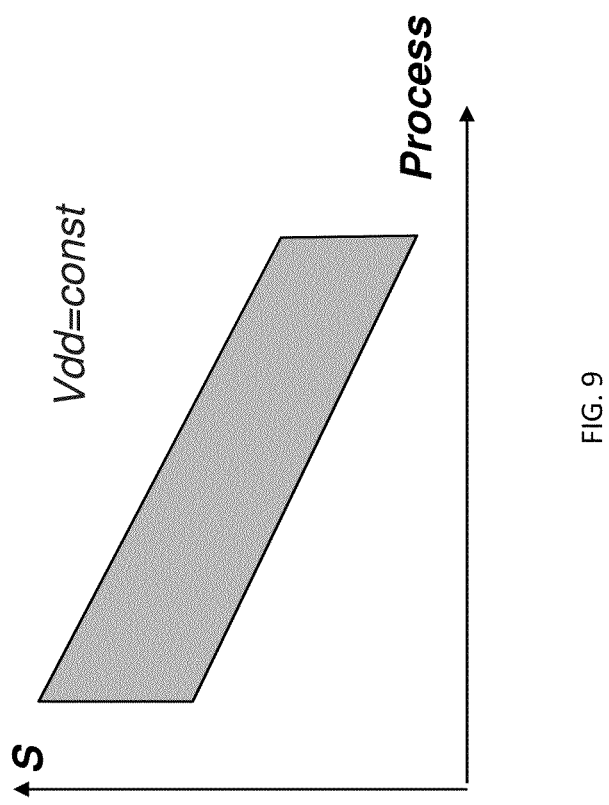
FIG. 9 is a schematic diagram illustrating PSRO characterization.
Figure 8:
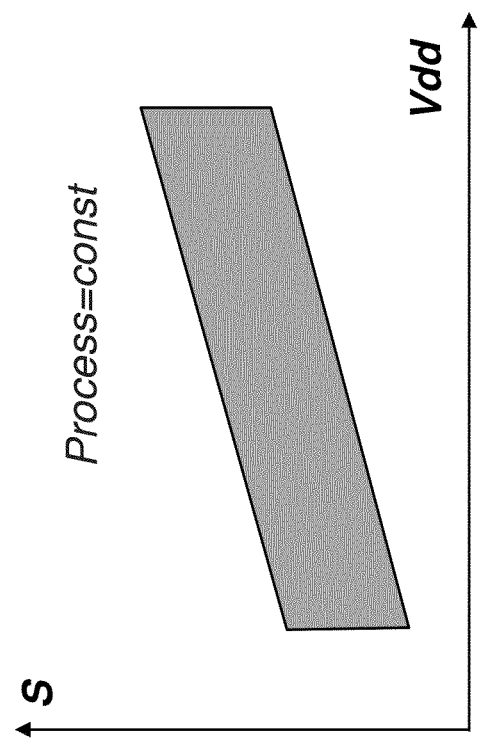
FIG. 8 is a schematic diagram illustrating PSRO characterization.

FIGS. 8 and 9 illustrate the timing results. Statistical timing computes timing slack of critical path in linear canonical form as:

$$S=s_0+a_V\Delta V+a_{Pr}\Delta X_{Pr}+a_T\Delta X_T+a_M\Delta X_M+a_R\Delta X_R=s_0+a_V\Delta V+a_{Pr}\Delta X_{Pr}+\Delta R_S.$$

In the above equation, the variable S represents the timing slack of the critical path, the variable $s_0$ represents the mean value of the timing slack, the variable $\Delta V$ represents the deviation of the supply voltage from its nominal value, the variable $a_V$ represents the sensitivity of the timing slack to the supply voltage variation, the variable $\Delta X_{Pr}$ represents the deviation of the process variable from its nominal value, the variable $a_{Pr}$ represents the sensitivity of the timing slack to the process variation, the variable $\Delta X_T$ represents the deviation of temperature from its nominal value, the variable $a_T$ represents the sensitivity of the timing slack to the temperature variation, the variable $\Delta X_M$ represents the variation of the interconnect metal parameters, the variable $a_M$ represents the sensitivity of the timing slack to the variation of the interconnect metal parameters, the variable $\Delta X_R$ represents the uncorrelated random variability, the variable $a_R$ represents the sensitivity of the timing slack to the uncorrelated random variability, the variable $\Delta R_S$ represents the combined variation of the timing slack due to temperature, interconnect metal and uncorrelated random variability.

More specifically, as shown in FIG. 8 if the process speed is held constant, the operating voltage (Vdd) increases as the slack (S) decreases. As shown in FIG. 7, if the operating voltage is held constant, as the slack decreases, the process speed increases.

For each critical path timing, the methods compute its slack in linear canonical form. Multiple critical paths are considered below.

Regarding bounding of process parameters from PSRO, the PSRO period is pre characterized as $T_{RO}=T_0+a_{RO,V}\Delta V+a_{RO,Pr}\Delta X_{Pr}+\Delta R$.

In the above equation, the variable $T_{RO}$ represents oscillation period of the PSRO, the variable $T_0$ represents mean value of the oscillation period, the variable $\Delta V$ represents deviation of supply voltage from its nominal value, the variable $a_{RO,V}$ represents the sensitivity of the oscillation period to variation of the supply voltage, the variable $\Delta X_{Pr}$ represents deviation of process variable from its nominal value, the variable $a_{RO,Pr}$ represents the sensitivity of the oscillation period to process variation, the variable $\Delta R$ represents variability of the oscillating period due to other sources of variation like interconnect metal, across chip variation, uncorrelated random variation, etc.

The measured PSRO period is $T_{Sens}$. The Vdd of measurement (sensing PSRO) is $V_{Sens}$. The other variability is bounded as $-\Delta R_{Bound} \leq \Delta R \leq \Delta R_{Bound}$, where the variable $\Delta R_{bound}$ represents the maximum possible variation of the PRSO oscillation period due to the other sources of variation like interconnect metal, across chip variation, etc. The variation of the process parameter is estimated as:

$$-\Delta R_{Bound} \leq \Delta R \leq \Delta R_{Bound}.$$

$$\Delta X_{Pr} = \frac{T_{Sens} - T_0 - a_{RO,V}\Delta V_{Sens} - \Delta R}{a_{RO,Pr}}.$$

In the above equation, the variable $T_{Sens}$ represents the measured oscillation period of the PSRO, the variable $T_0$ represents the mean value of the oscillation period, the variable $\Delta V_{Sens}$ represents the deviation of the supply voltage, when the PSRO period is measured, from the nominal value of the supply voltage, the variable $a_{RO,V}$ represents the sensitivity of the oscillation period to variation of the supply voltage, the variable $\Delta X_{Pr}$ represents deviation of the process variable from its nominal value, the variable $a_{RO,Pr}$ represents the sensitivity of the oscillation period to the process variation, the variable $\Delta R$ represents variability of the oscillating period the sources of variation like interconnect metal, across chip variation, uncorrelated random variation, etc.

The bounded estimate of process parameter assuming $a_{RO,Pr}>0$ is determined as follows:

$$\frac{T_{Sens} - T_0 - a_{RO,V}\Delta V_{Sens} - \Delta R_{Bound}}{a_{RO,Pr}} \leq$$

$$\Delta X_{Pr} \leq \frac{T_{Sens} - T_0 - a_{RO,V}\Delta V_{Sens} + \Delta R_{Bound}}{a_{RO,Pr}}.$$

Regarding computation of Vdd assignment, the statistical timing slack of critical path is $S=s_0+a_V\Delta V+a_{Pr}\Delta X_{Pr}+\Delta R_S$. The bounded estimate of process parameter assuming $a_{RO,Pr}>0$ is determined as follows:

$$\frac{T_{Sens} - T_0 - a_{RO,V}\Delta V_{Sens} - \Delta R_{Bound}}{a_{RO,Pr}} \leq$$

$$\Delta X_{Pr} \leq \frac{T_{Sens} - T_0 - a_{RO,V}\Delta V_{Sens} + \Delta R_{Bound}}{a_{RO,Pr}}$$

Bounded timing slack (assuming $a_{Pr}>0$) is determined as follows:

$$s_0 + a_V\Delta V + a_{Pr}\frac{T_{Sens} - T_0 - a_{RO,V}\Delta V_{Sens} - \Delta R_{Bound}}{a_{RO,Pr}} - 3\Delta R_S \leq S$$

The coefficient 3 corresponds to 3 sigma estimate. Vdd is computed to ensure Slack>0 (assuming $a_V$>0) is determined as follows:

$$\Delta V \geq \frac{3\Delta R_S}{a_V} - \frac{s_0}{a_V} - \frac{a_{Pr}}{a_V} \frac{T_{Sens} - T_0 - a_{RO,V}\Delta V_{Sens} - \Delta R_{Bound}}{a_{RO,Pr}}$$

In the above equation, the variable $\Delta V$ represents the deviation of the computed supply voltage from the nominal value, ensuring positive slack, the variable $T_{Sens}$ represents the measured oscillation period of the PSRO, the variable $T_0$ represents the mean value of the oscillation period, the variable $s_0$ represents the mean value of the timing slack, the variable $\Delta V_{Sens}$ represents the deviation of the supply voltage, when the PSRO period is measured, from the nominal value of the supply voltage, the variable $a_{RO,V}$ represents the sensitivity of the oscillation period to the variation of the supply voltage, the variable $a_V$ represents the sensitivity of the timing slack to the variation of the supply voltage, the variable $a_{RO,Pr}$ represents the sensitivity of the oscillation period to the process variation, the variable $a_{Pr}$ represents the sensitivity of the timing slack to the process variation, the variable $\Delta R_S$ represents the timing slack variability due to the other sources of variation like interconnect metal, across chip variation, uncorrelated random variation, etc., the variable $\Delta R_{Bound}$ represents the upper bound of the oscillating variability period due to other sources of variation like interconnect metal, across chip variation, uncorrelated random variation, etc.

Thus, using multiple PSROs computes the most reliable bound of process parameter, so that all PSRO equations are satisfied. Multiple critical paths compute Vdd at which slacks of all critical paths are positive. There are multiple Vt families and more terms in PSRO and slack expressions as shown:

$T_{RO} = T_O + a_{RO,V}\Delta V + a_{RO,Pr}\Delta X_{Pr} + a_{RO,t}\Delta X_t + a_{RO,m}\Delta X_M + \Delta R$.

In the above equation, the variable $T_{RO}$ represents the oscillation period of the PSRO, the variable $T_0$ represents the mean value of the oscillation period, the variable $\Delta V$ represents the deviation of the supply voltage from its nominal value, the variable $a_{RO,V}$ represents the sensitivity of the oscillation period to the variation of the supply voltage, the variable $\Delta X_{Pr}$ represents the deviation of the process variable from its nominal value, the variable $a_{RO,Pr}$ represents the sensitivity of the oscillation period to the process variation, the variable $\Delta X_t$ represents the deviation of the temperature from its nominal value, the variable $a_t$ represents the sensitivity of the oscillation period to the temperature, the variable $\Delta X_M$ represents the deviation of the interconnect metal parameters from their nominal value, the variable $a_{RO,M}$ represents the sensitivity of the oscillation period to the interconnect metal parameters, the variable $\Delta R$ represents variability of the oscillating period due to the other sources of variation like across chip variation, uncorrelated random variation, etc.

Nonlinear dependence of PSRO period and its random variability on Vdd and Process as: $T_{RO} = T_0(\Delta V, \Delta X_{Pr}) + \Delta R(\Delta V, \Delta X_{Pr})$.

In the above equation, the variable $T_{RO}$ represents the oscillation period of the PSRO, the variable $T_0$ represents the mean value of the oscillation period, the variable $\Delta V$ represents the deviation of the supply voltage from its nominal value, the variable $\Delta X_{Pr}$ represents the deviation of the process variable from its nominal value, the term $T_0 (\Delta V, \Delta X_{Pr})$ represents the mean value of the oscillation period as a nonlinear function of the supply voltage and the process variations, the term $R(\Delta V, \Delta X_{Pr})$ represents the random variation of the oscillation period as nonlinear function of the supply voltage and the process variations. Thus, as shown above, these systems and methods compute bounds by solving non linear equations.

Parameters included (and exclude from delta R) are items such as voltage, temperature, and a single Vt. The systems and methods herein use all Vt families in a design, to find delta PSRO (systematically calculating across chip variation (ACV)). Thus, the methods and systems herein perform statistical analysis of satellite PSROs and consider all metal layer parameters (capacitance, resistance, etc.). Capacitance and resistance are inversely related and are contained in one parameter per layer. These can be taken from kerf data or an on chip monitor. The systems and methods herein use the N/P mis-tracking parameter that can be taken from the SPM macro, or possibly from the kerf data.

Pre-characterization work used to derive the canonical equation for the PSRO is shown as: $T_{RO} = T_O + a_{RO,V}\Delta V + a_{RO,Pr}\Delta X_{Pr} + \Delta R$. For each PSRO Vt type, the systems and methods herein perform a hardware verses modeling comparison of a "PSRO path". In modeling, Einstimer is used to make a path out of the linear elements in a PSRO. A Spice analysis can also be used. Hardware comparison is achieved by data gathering and regression. The $A_{ROV_{total}}$ is a linear addition of the independent PSRO Vt $A_{ROV_s}$. The systems and methods herein provide a plan for back-annotation of all parameters that are not in delta R.

The systems and methods herein perform the following process at the tester for every chip. The systems and methods gather chip specific data, test Voltage, Temp, Kerf Data, SPM Data, PSRO (all PSRO, all Vt). The systems and methods herein solve for delta V to create equation inputs and create sigma values to back annotate to path delay equations. The systems and methods may shift and scale to annotate the path delay equations. The systems and methods mathematically solve for delta V (which gives the bin for each part). The systems and methods predict the speed of ASST Paths for chip. The systems and methods use sigma values to back annotate into canonicals for the ASST paths and predict the frequency (bound experiment), which is at least not worse than customer speed. The systems and methods run ASST at a predicted Vdd and verify passing tests at nominal Vdd minus delta V and determine how this relates to the normal ASST pass/fail criteria. If the chip does not pass, it is either thrown out, or ratcheted down delta V, and the process then tries again. The methods assign binning accordingly.

Regarding Bounds by multiple PSRO, PSRO periods are pre-characterized as:

$$T_{RO,1} = T_{0,1} + a_{RO,V,1}\Delta V + a_{RO,Vt1}\Delta X_{Vt1} + \Delta R_1$$

$$T_{RO,1} = T_{0,1} + a_{RO,V,2}\Delta V + a_{RO,Vt2}\Delta X_{Vt2} + \Delta R_2.$$

Measured PSRO periods are $T_{Sen1}$, $T_{Sen2}$. Vdd of measurement (sensing PSRO) $\Delta V_{Sen}$ is the same for all PSROs. The other variabilities are bounded as: $-\Delta R_{Bnd1} \leq \Delta R_1 \leq \Delta R_{Bnd2} - \Delta R_{Bnd2} \leq \Delta R_2 \leq \Delta R_{Bnd2}$. Bounds of process parameters for different Vt families (assuming positive sensitivities $a_{RO,Vt}$>0)

$$\frac{T_{Sen1} - T_{0,1} - a_{RO,V,1}\Delta V_{Sen} - \Delta R_{Bnd1}}{a_{RO,Vt1}} \leq$$

$$\Delta X_{Vt1} \leq \frac{T_{Sen1} - T_{0,1} - a_{RO,V,1}\Delta V_{Sen} + \Delta R_{Bnd,1}}{a_{RO,Vt1}}$$

$$\frac{T_{Sen2} - T_{0,2} - a_{RO,V,2}\Delta V_{Sen} - \Delta R_{Bnd2}}{a_{RO,Vt2}} \leq$$

-continued $$\Delta X_{Vt2} \leq \frac{T_{Sen2} - T_{0,2} - a_{RO,V,2}\Delta V_{Sen} + \Delta R_{Bnd,2}}{a_{RO,Vt2}}$$

Negative sign of $a_{RO,Vt1}$, i.e. $a_{RO,Vt1} < 0$) reverses the bounds $$\frac{T_{Sen1} - T_{0,1} - a_{RO,V,1}\Delta V_{Sen} + \Delta R_{Bnd1}}{a_{RO,Vt1}} \leq$$

$$\Delta X_{Vt1} \leq \frac{T_{Sen1} - T_{0,1} - a_{RO,V,1}\Delta V_{Sen} - \Delta R_{Bnd,1}}{a_{RO,Vt1}}.$$

In the above equation, the variables $T_{R0,1}$, $T_{R0,2}$ represent the oscillation periods of the PSROs of two different Vt families, the variables $T_{0,1}$, $T_{0,2}$ represent the mean values of the PSRO oscillation periods, the variable $\Delta V$ represents the deviation of the supply voltage from its nominal value, the variables $a_{RO,V,1}$, $a_{RO,V,1}$ represent the sensitivities of the oscillation periods to the variation of the supply voltage, the variables $\Delta X_{Vt1}$, $\Delta X_{Vt2}$ represent the deviations of the process variables of two different Vt families from their nominal values, the variables $a_{RO,Vt1}$, $a_{RO,Vt2}$ represent the sensitivities of the oscillation periods to the process variations of different Vt families, the variables $\Delta R_1$, $\Delta R_2$ represent the variabilities of the oscillating periods due to the other sources of variation like temperature, interconnect metal, across chip variation, uncorrelated random variation, etc., the variables $\Delta R_{Bnd1}$, $\Delta R_{Bnd2}$ represent the bounds of the oscillation period variations due to the other sources of variation like temperature, interconnect metal, across chip variation, uncorrelated random variation, etc., the variable $\Delta V_{Sen}$ represents the deviation of supply voltage at the time of PSRO measurements from the nominal supply voltage, the variables $T_{Sen1}$, $T_{sen2}$ represent the measured oscillation periods of the PSROs of two different Vt families.

Vdd assignment for multiple VT families include statistical timing slack of critical path shown as: $S=s_0+a_v\Delta V+a_{Vt1}\Delta X_{Vt1}+a_{Vt2}\Delta X_{Vt2}\Delta R_S$.

Bounded timing slack (assuming $a_{Vt1}>0$, $a_{Vt2}>0$) is determined as follows:

$$S \geq s_0 + a_V\Delta V + a_{Vt1}\Delta X_{Vt1,MinBnd} + a_{Vt2}\Delta X_{Vt2,MinBnd} - 3\Delta R_S$$

$$\Delta X_{Vt2,MinBnd} = \frac{T_{Sen2} - T_{0,2} - a_{RO,V,2}\Delta V_{Sen} - \Delta R_{Bnd2}}{a_{RO,Vt2}}$$

where $$\Delta X_{Vt1,MinBnd} = \frac{T_{Sen1} - T_{0,1} - a_{RO,V,1}\Delta V_{Sen} - \Delta R_{Bnd1}}{a_{RO,Vt1}}$$

Coefficient 3 corresponds to 3 sigma estimate

Vdd computed to ensure that slack is positive (S>0), assuming $a_v>0$ is determined as follows:

$$\Delta V \geq \frac{3\Delta R_S}{a_V} - \frac{s_0}{a_V} - \frac{a_{Vt1}}{a_V}\Delta X_{Vt1,MinBnd} - \frac{a_{Vt2}}{a_V}\Delta X_{Vt2,MinBnd}.$$

In the above equation, the variable S represents the timing slack of the critical path, the variable $s_0$ represents the mean value of the timing slack, the variable $\Delta V$ represents the deviation of the supply voltage from its nominal value, the variable $a_V$ represents the sensitivity of the timing slack to the supply voltage variation, the variables $\Delta X_{Vt1}$, $\Delta X_{Vt2}$ represent the deviations of the process variables of two different Vt families from their nominal values, the variables $a_{Vt1}$, $a_{Vt1}$ represent the sensitivities of the timing slack to the process variations of two different Vt families, the variable $\Delta R_S$ represents the combined variation of the timing slack due to temperature, interconnect metal and uncorrelated random variability, the variables $T_{0,1}$, $T_{0,2}$ represent the mean values of the PSRO oscillation periods, the variable $\Delta V$ represents the deviation of the supply voltage from its nominal value, the variables $a_{RO,V,1}$, $a_{RO,V,1}$ represent the sensitivities of the oscillation periods to the variation of the supply voltage, the variables $a_{RO,Vt1}$, $a_{RO,Vt2}$ represent the sensitivities of the oscillation periods to the process variations of different Vt families, the variables $\Delta R_{Bnd1}$, $\Delta R_{Bnd2}$ represent the bounds of the oscillation period variations due to the other sources of variation like temperature, interconnect metal, across chip variation, uncorrelated random variation, etc., the variable $\Delta V_{Sen}$ represents the deviation of the supply voltage at the time of PSRO measurements from the nominal value, the variables $T_{Sen1}$, $T_{Sen2}$ represent the measured oscillation periods of the PSROs of two different Vt families.

Regarding the Yield Canonical Equation, every slack value is in canonical form for process and environment parameters. All slack distributions combined give the chip yield value. The slacks are shifted; and all distributions are combined to a new distribution. Also, the smallest slack has the highest weight. The number of paths leading to the slack is also part of this distribution. High and low voltage runs describing the voltage limits are combined. Further, the probability of a zero slack value is the chip yield. The chip yield can be expressed in canonical form as function of the process and environment parameters. The 3 sigma probability which has all slack positive is the chip yield. Additionally, the foregoing depends on all process and environment parameters used in timing.

In final testing, the system and methods herein show the values for a set of parameters, including average PSRO values per VT-family—process intrinsic parameter; Delta PSRO for systematic ACV of each chip—process systematic parameter; Ion and Vt for Nfet and Pfet from SPM macro—process N/P off-track parameter; etc. The systems and methods herein can also use kerf metal level resistance data—set the metal parameter value.

The systems and methods herein select a lower voltage for power reduction. For each chip design, the systems and methods herein create and store the yield canonical form equation for hardware disposition. This equation can be output from the final timing run. The systems and methods herein inset the parameter data for each chip into this yield equation. All non-measured parameters will be held to the WC 3 sigma value, and this will push the yield into the positive range. Each non-measured parameter (or a combination of these) can be moved to solve the resulting equation for each specific chip. For example, the Vdd value will give the lowest power with guaranty for a working chip, and the reduction of Vdd will push the yield back to the zero value. Also, the clock frequency change will give the best performance for a working chip. If the chip has selective voltage binning, the systems and methods herein will determine the shipping bin for the specific chip fitting this new reduced Vdd value.

In the verification process, a canonical form of the ASST path delay values can be used for verification of the method. The parameter values measured for the chip can be used to verify the path delay values measured. Delay values not dependent on the parameters measured include SRAM delay, PLL delay, VCS sensitivity, Voltage islands need WC timing setting. The values can also be verified with the ASST path analysis. Path values can be used to add chip specific values to these items.

Benefits of the methods and systems herein include higher flexibility and accuracy than the current linear global setting for optimized chip usage. ACV is part of the Vdd and bin selection. Currently, ACV stretches over 5 bins. Inclusion of Vt-family data, using the dominant VT group on the chip not the global setting. There is a possibility to include wire results, even for smaller distributions across the wafer from the Kerf data or an on chip monitor. There is an inclusion of N/P parameter setting, and an inclusion of ASST path delay.

Figure 10:
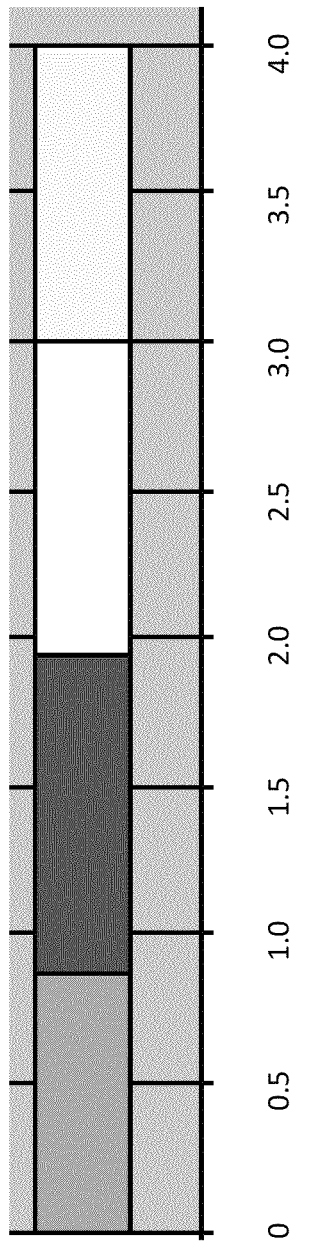
FIG. 10 is a schematic diagram illustrating critical path predictions.
Figure 11:
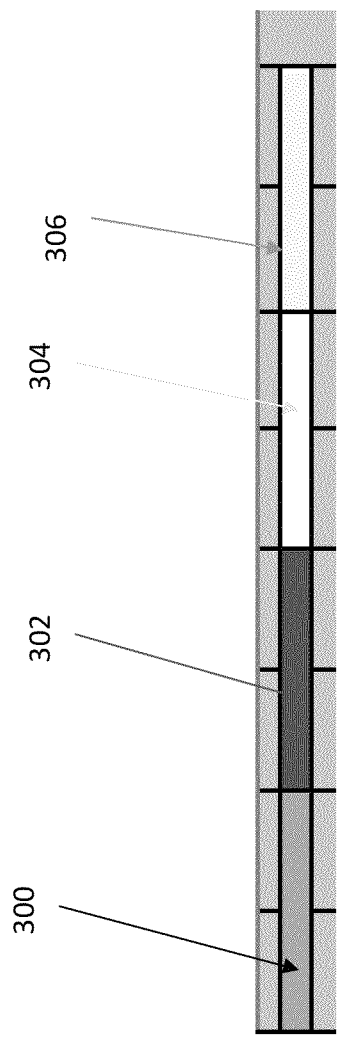
FIG. 11 is a schematic diagram illustrating critical path predictions.

FIGS. 10 and 11 show critical path delay components. Paths are broken up into delay components (shown in different shading in FIGS. 10 and 11) that react differently to process voltage and temperature (PVT). FIG. 11 is a more generic representation of that shown in FIG. 10. Items 300, 302, 304, 306 in FIG. 11 show the different path delay mark up components. Thus, critical path predictions that can be made from the PSRO delay samples on the tester are shown in FIGS. 10 and 11. Critical path prediction is the sum of the component parts. Path delay is a function of Vdd. The methods and systems herein numerically solve for Vdd as a function of delay with delay set to the cycle time.

Figure 12:
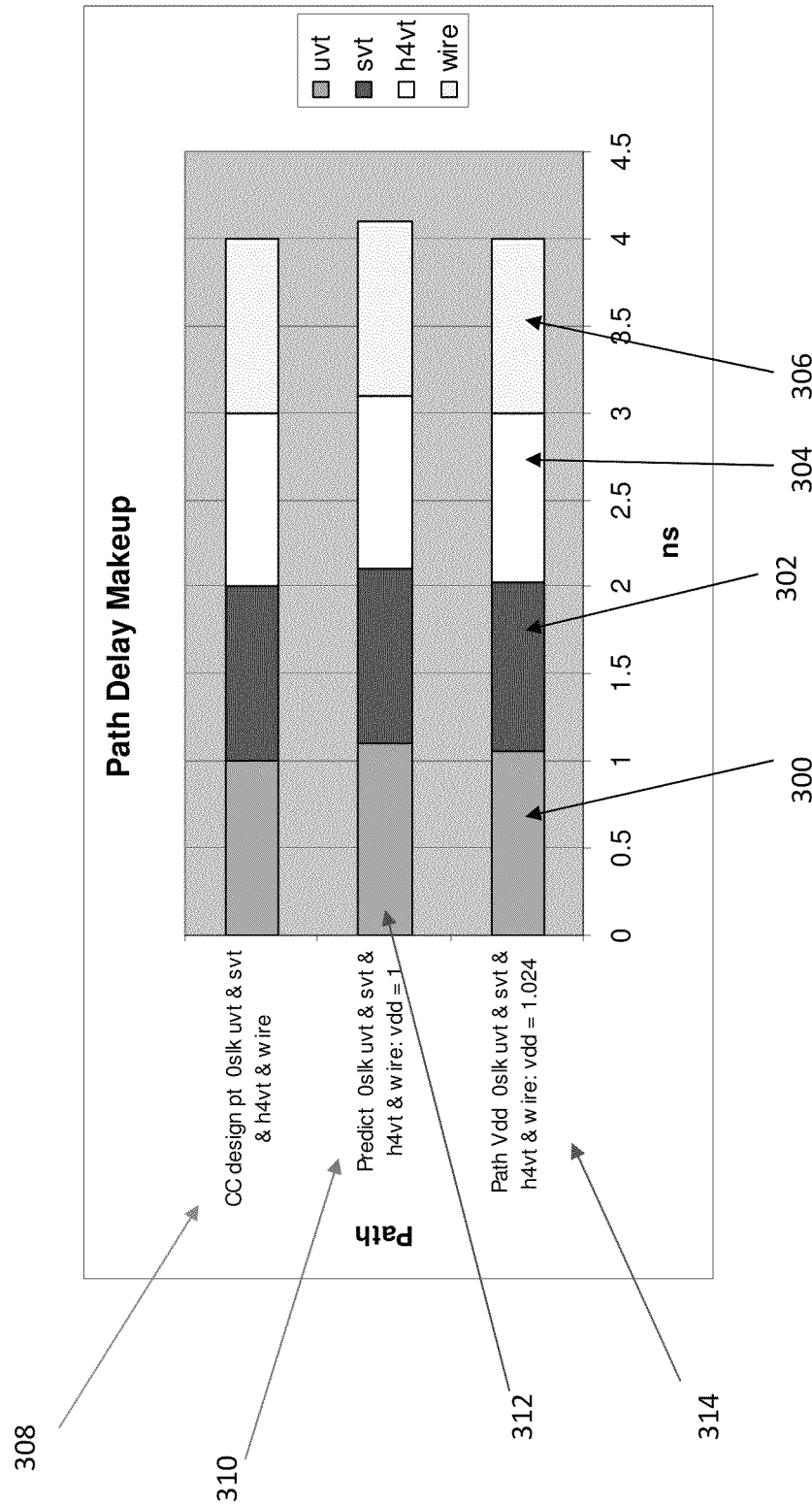
FIG. 12 is a chart illustrating testing SVB method performance recovery by increasing Vdd.

FIG. 12 shows tester SVB method performance recovery resulting from increasing Vdd. In item 308, FIG. 12 shows with Reference Corner (nominal) path timing information. In item 310, with PSRO Delay Samples, the methods predict the path delay. In item 312, hypothetically, prediction is determined that uvt has a 10% increase in delay. In item 314, the methods adjust this performance with voltage for 0 slack (4 ns). In this case example, Vdd=1.024 V. As shown, each component changes differently with voltage change.

Figure 13:
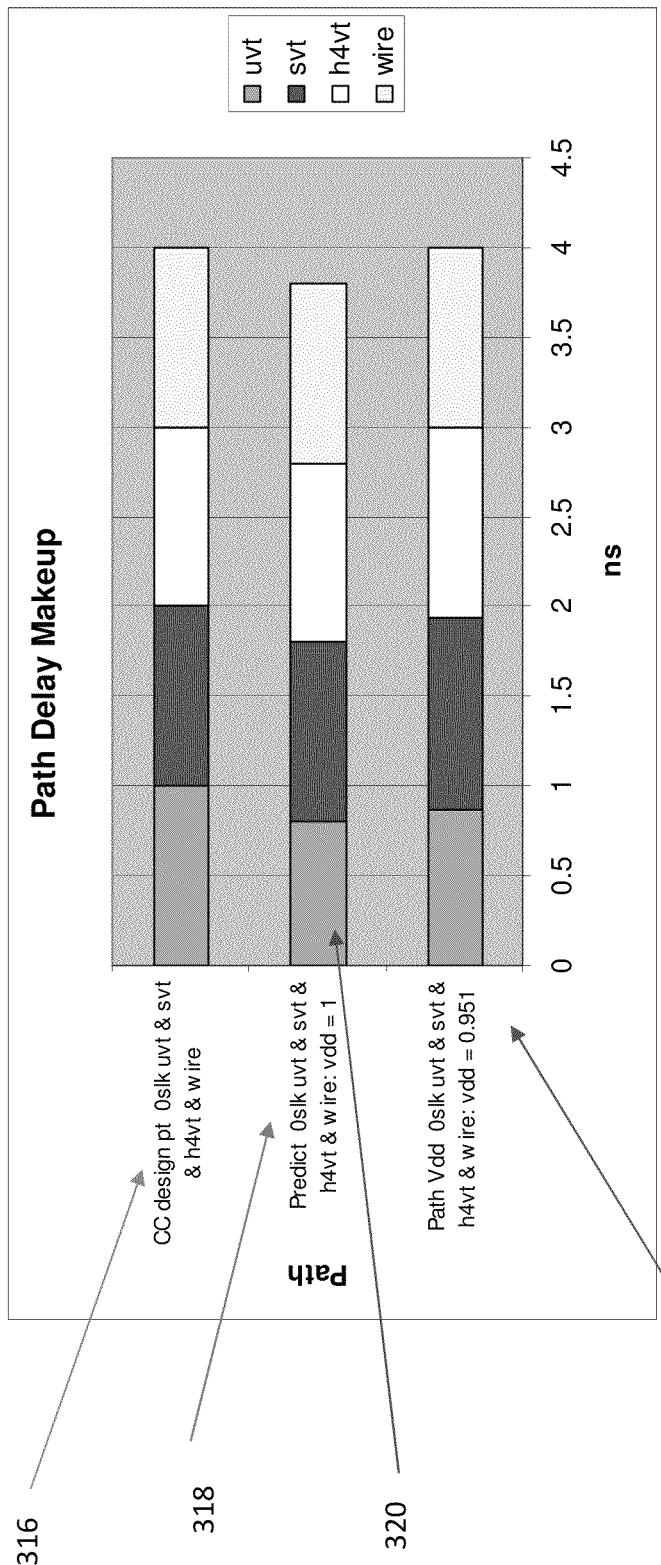
FIG. 13 is a chart illustrating testing SVB method performance recovery by decreasing Vdd.

FIG. 13 shows tester SVB method performance recovery resulting from decreasing Vdd. In item 316, the FIG. 13 shows Reference Corner (CC) path timing information. In item 318, at the tester, the methods use PSRO delay samples and predict the path delay. In item 320, hypothetically, prediction is determined that uvt has a 20% decrease in delay. In item 322, the methods adjust this performance with voltage for 0 slack (4 ns).

Figure 14:
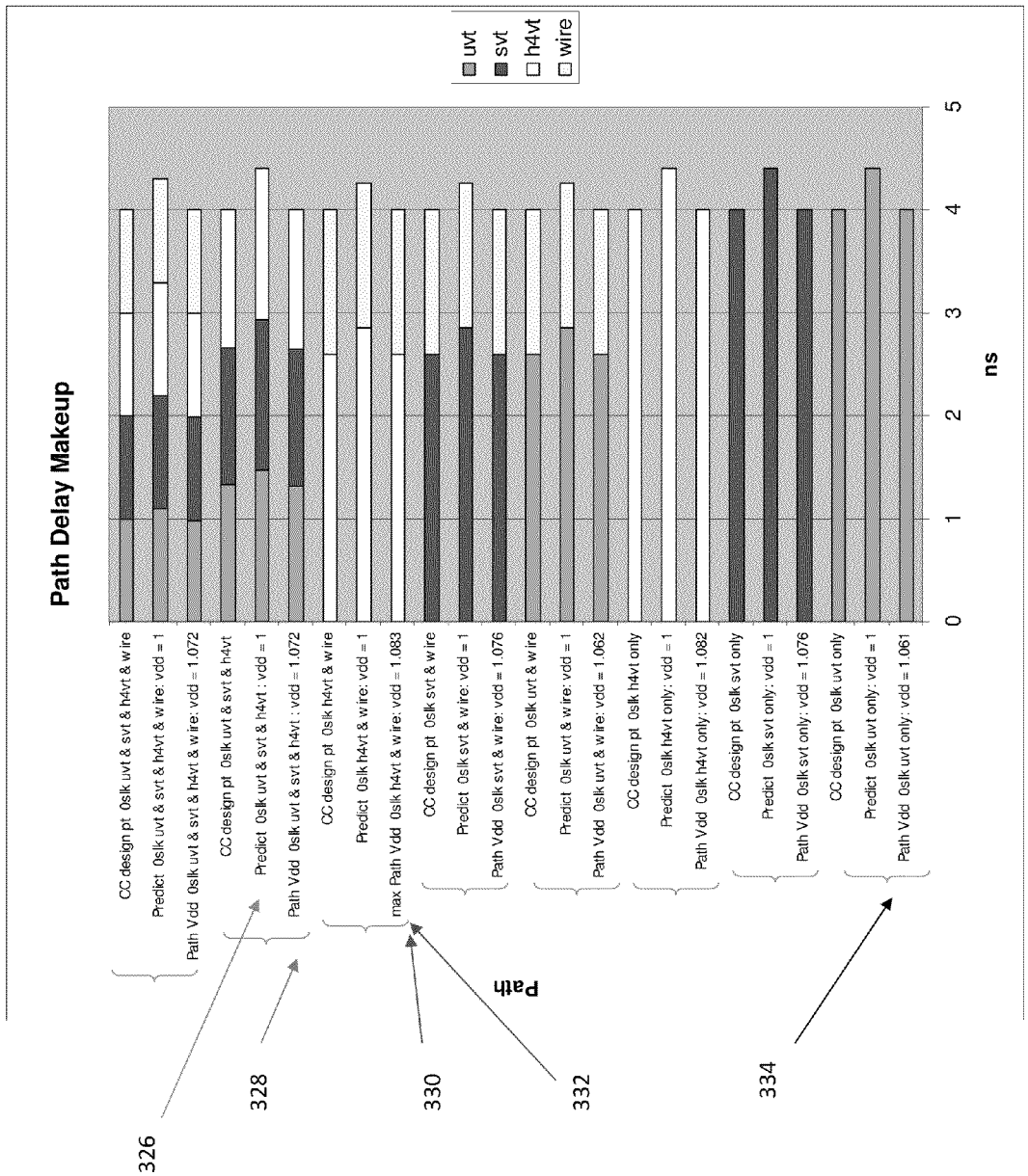
FIG. 14 is a chart illustrating Path Delay Makeup.

FIG. 14 is a chart of the path delay Makeup. In item 326, FIG. 14 shows testing using PSRO data, and this determines that all the FET are 10% slow. In item 328, FIG. 14 shows that for each path, the systems and methods herein solve for 0 slack voltage (Vdd). In item 330, FIG. 14 shows that the maximum path Vdd required for this chip is +1.083 V. In item 332, FIG. 14 shows that the slow parts are dominated by the least Sensitive Paths (hvt+wire). In item 334, FIG. 14 shows that the fast parts will be dominated by most sensitive paths (uvt only).

Figure 15:
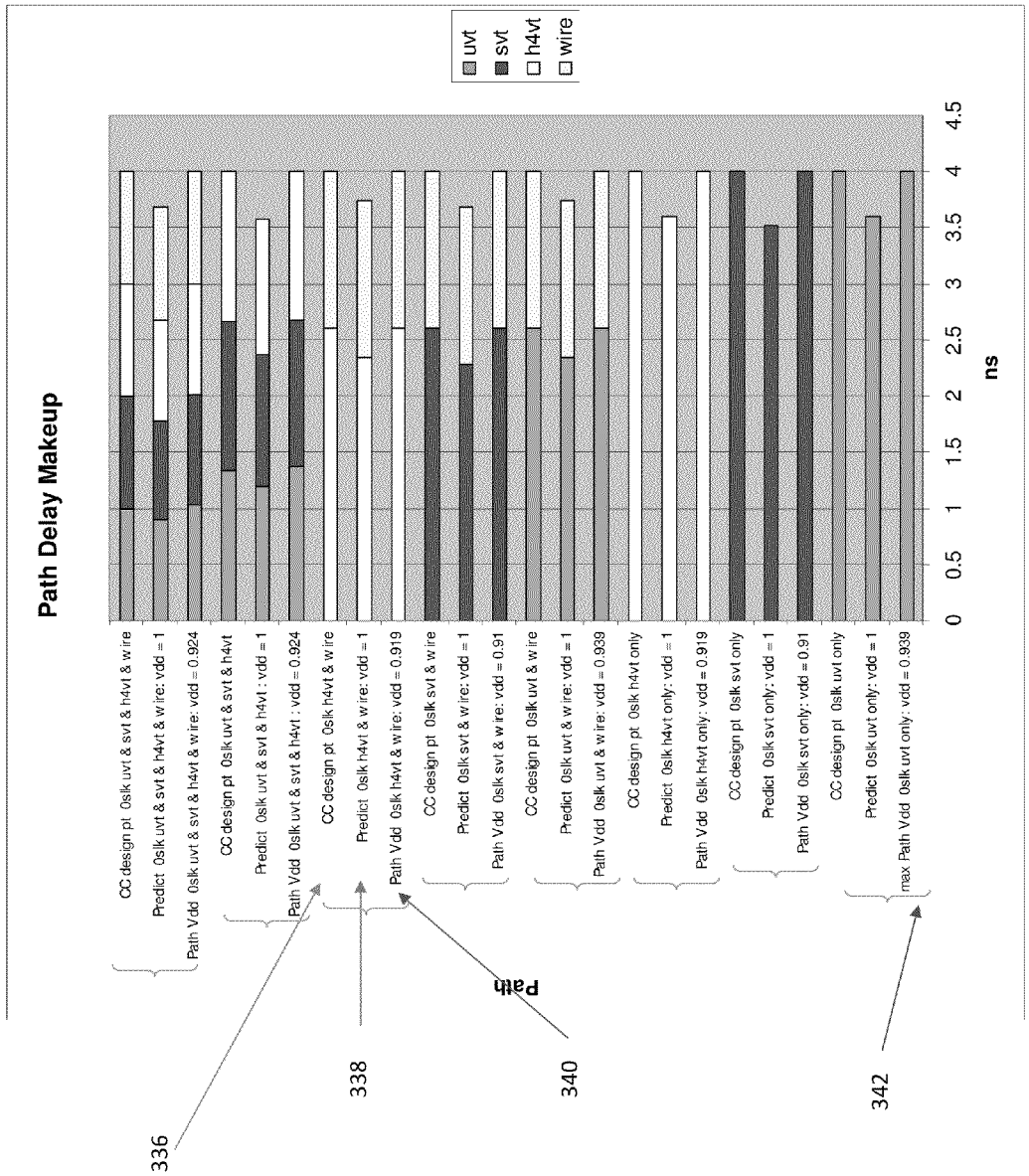
FIG. 15 is a chart illustrating Path Delay Makeup.

FIG. 15 is a chart of path delay Makeup. In item 336, FIG. 15 shows the corner condition (CC) path timing information. In item 338, with the tester using PSRO data, the methods and systems herein predict that there is a 10% decrease in uvt & hvt delays and a 12% in svt. In item 340, FIG. 15 shows that for each case, the path adjusts this performance with voltage for 0 slack. In item 342, Maximum Path Vdd required for this chip is shown to be 0.939 my.

Figure 16:
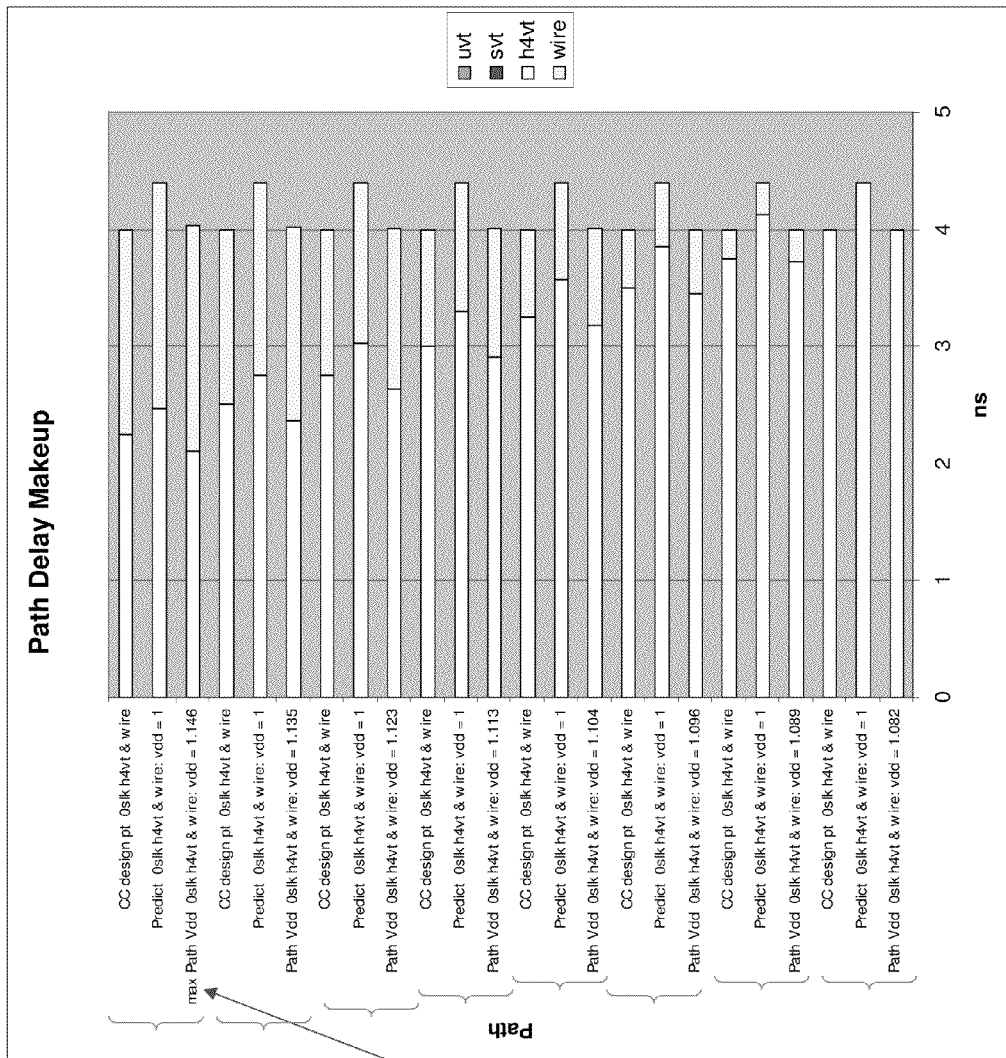
FIG. 16 is a chart illustrating Path Delay Makeup.

FIG. 16 shows a similar chart of path delay showing how the systems and methods herein minimize the number of critical paths to analyze at the test. Item 350 shows that the number of paths to evaluate at the tester can be limited to a small number. When recovering performance with voltage, the least sensitive dominate. In this case, the path with the most wire dominates.

Figure 17:
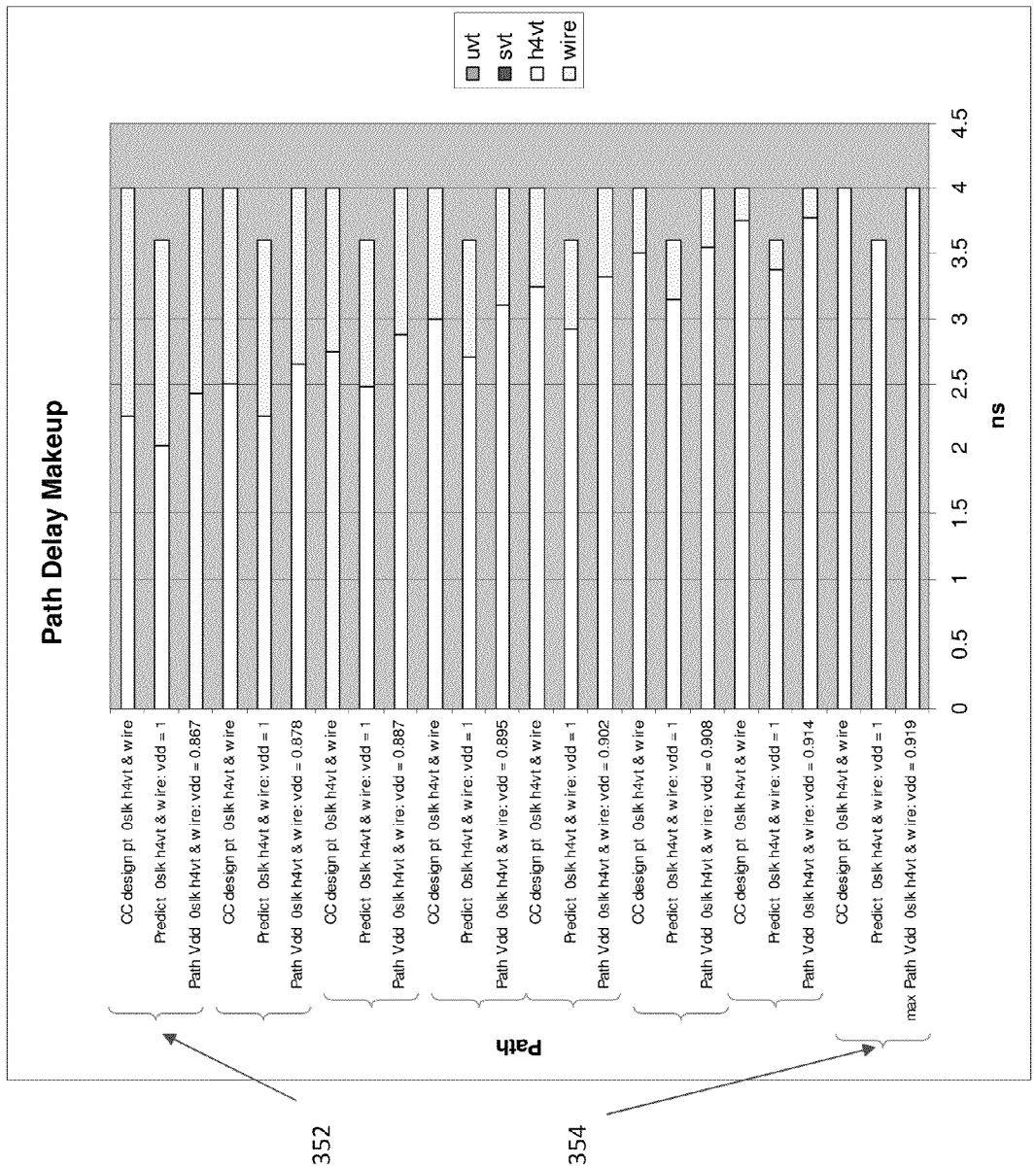
FIG. 17 is a chart illustrating Path Delay Makeup.

FIG. 17 is a chart of path delay Makeup showing how the systems and methods herein minimize the number of critical paths to analyze at the test. Item 352 in FIG. 17 shows that with fast parts (giving back voltage), the most sensitive paths dominate. With slow parts (adding voltage to recover performance), the least sensitive paths dominate. Item 354 shows that in this case (fast) the path with the most transistor delay dominates. None of the paths in the middle surface as dominating (requiring more voltage).

With regard to critical paths to consider at the tester, the Bounding Path Set can be limited to each VT type with minimum Wire and Maximum Wire which includes: 1) Uvt only, 2) Uvt & max wire, 3) Svt only, 4) Svt & max wire, 5) Hvt only; and 6) Hvt & max wire.

Figure 18:
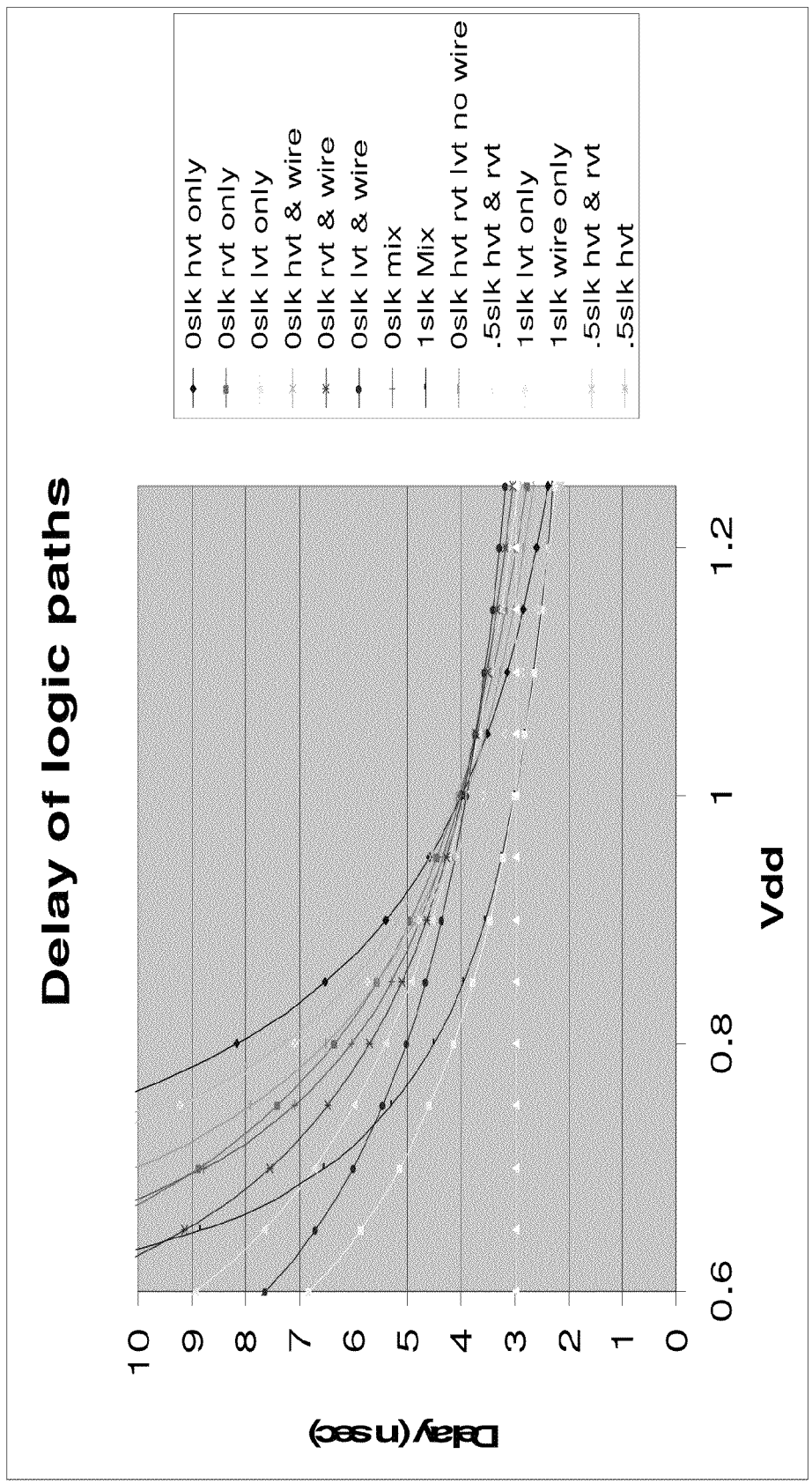
FIG. 18 is a chart illustrating delay of logic paths.
Figure 19:
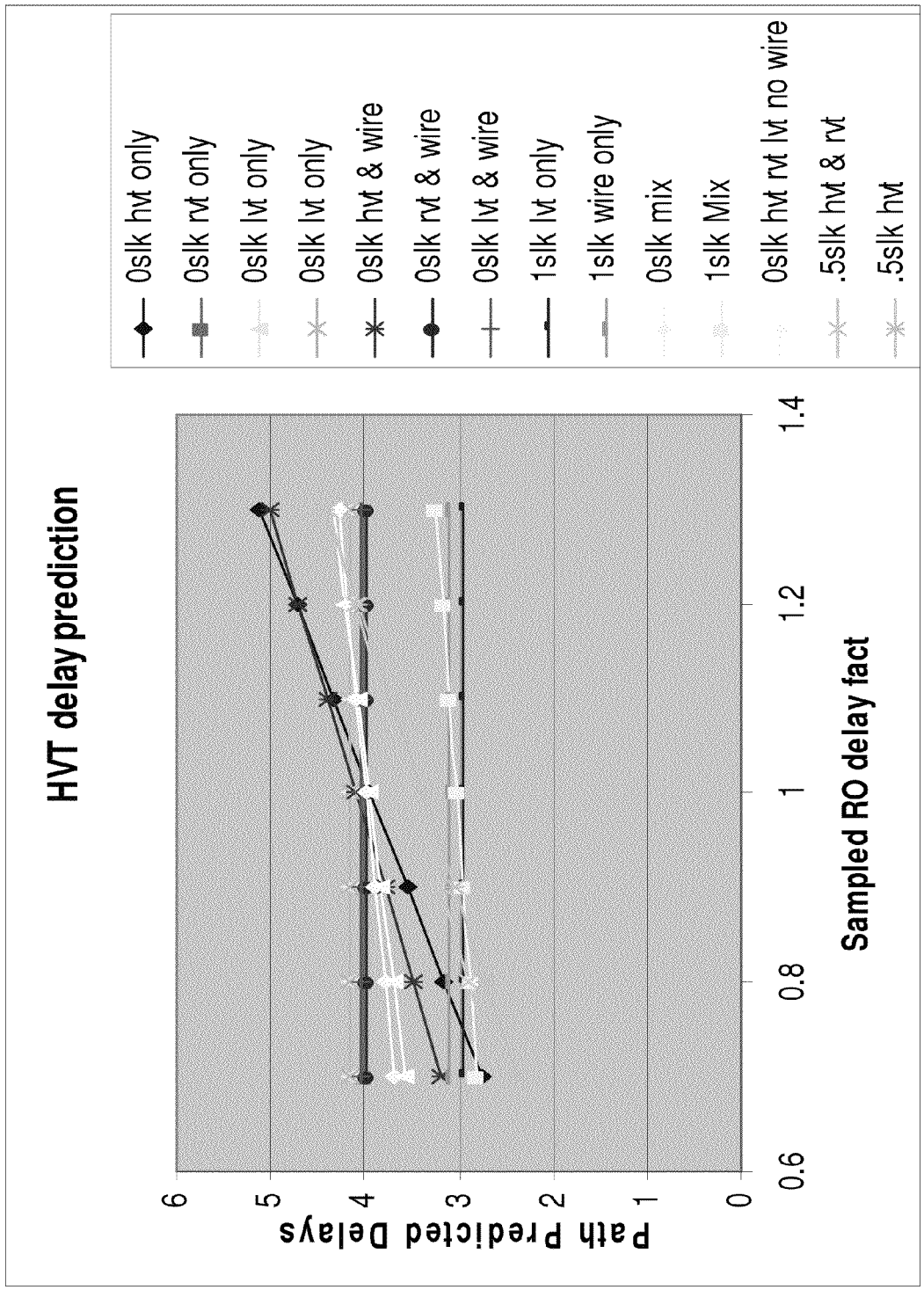
FIG. 19 is a chart illustrating HVT delay prediction.

FIG. 18 is a chart that illustrates delay of logic paths. There are many potential critical paths which become dominant under varying conditions. FIG. 19 is a similar chart with HVT delay prediction, and sampled RO delay facts are displayed.

Figure 20:
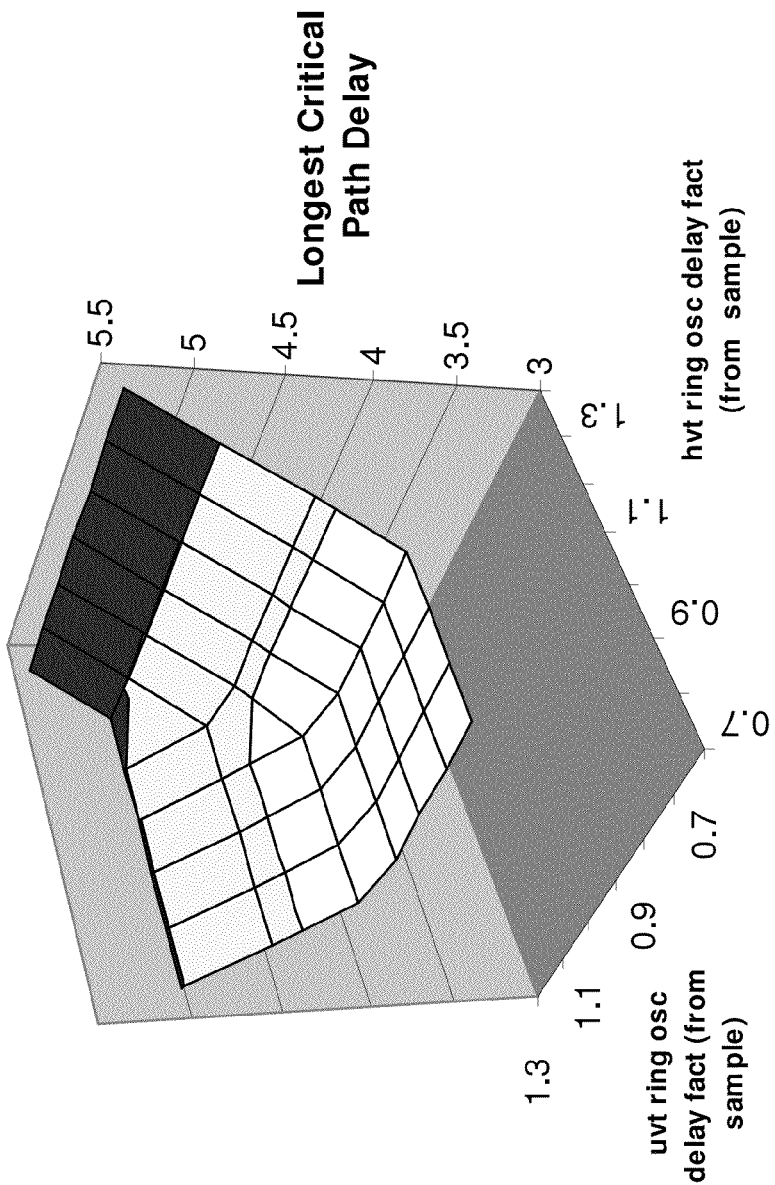
FIG. 20 is a chart illustrating longest predicted path delays as a function of PSRO.

FIG. 20 is a chart that shows the longest predicted critical path delay as a function of PSRO. The samples show uvt ring osc delay factor (from sample) and hvt ring osc delay factor (from sample). Critical path prediction is the sum of the component parts. The parts are as follows: ptcp_delay=hvt_ptcp_delay+svt_ptcp_delay+uvt_ptcp_delay+wire_ptcp_delay ptcp_delay, Predicted Tester Critical Path Delay, *vt_ptcp_delay, Predicted Tester Critical Path Component Delay dly_hvt_cp_cc, hvt delay of the critical path at a corner condition (Timing Report), dly_hvt_ro_cc, hvt delay of the ring oscillator at a corner condition (Spice Analysis), pcp—Predicted Critical Path, cp—Critical Path.

Figure 21:
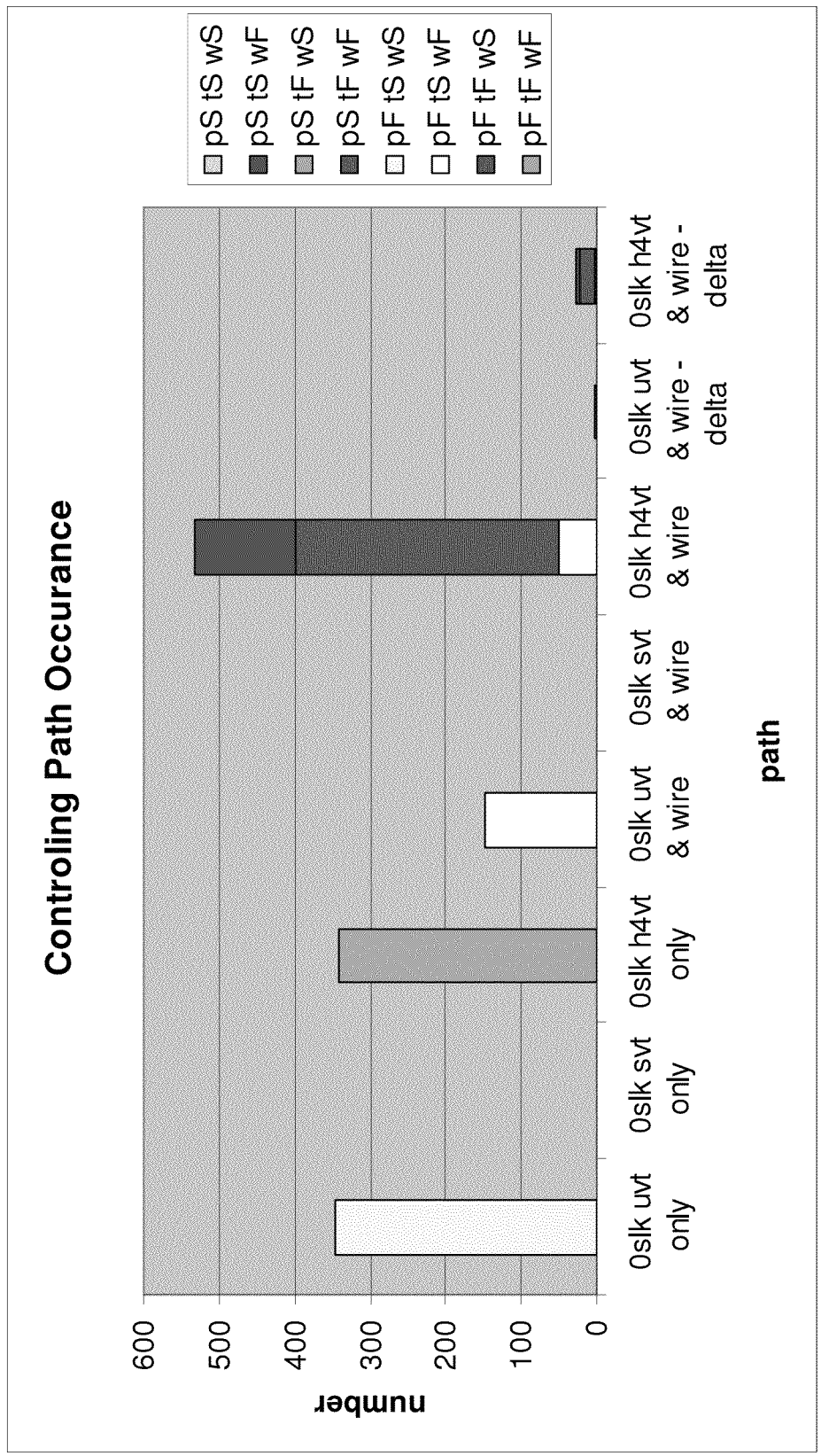
FIG. 21 is a chart illustrating controlling path occurrence.

FIG. 21 is a chart illustrating the effect of controlling the path occurrence. In FIG. 21, Monte Carlo random simulations are show with max transistor paths and max transistor with max wire paths dominate.

Methods and systems herein perform delay prediction using parametric wire delay information and wire information from a wire PSRO that includes selectable wire delay paths. The methods can utilize the power of an EinsTimer to identify critical path information and sensitivities and can perform extraction of Canonical Equations (Parameter Sensitivities).

Figure 22:
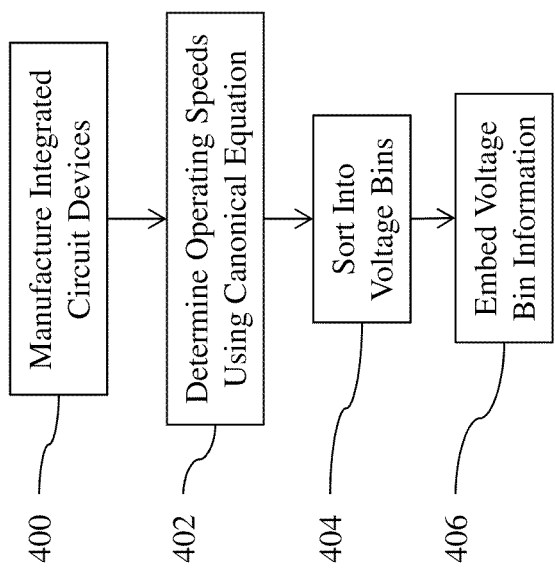
FIG. 22 is a schematic diagram of a device containing many integrated circuit devices that have the sorted into different voltage bins and that are controlled using a power controller.

FIG. 22 is a flow diagram illustrating an exemplary a method of optimizing power usage in an integrated circuit design. In item 400, this method manufactures integrated circuit devices according to the same integrated circuit design, using manufacturing equipment. The integrated circuit design produces integrated circuit devices that are identically designed and are produced in what is intended to be the same manufacturing process, yet some perform at different operating speeds because of unintended or physically uncontrollable manufacturing process variations.

Many portions of the integrated circuit devices can operate at different threshold voltages, and for convenience these are sometimes referred to herein as different threshold voltage portions. In item 402, this method determines the operating speed of each of the integrated circuit devices based on delay parameters that are applied to a canonical equation that evaluates the different threshold voltage portions of each of the integrated circuit devices differently. The canonical equation in item 402 can be customized for each of the integrated circuit devices based on ranges of the delay parameters.

In item 402, the method can determine the operating speed of each of the integrated circuit devices by obtaining data from at least one ring oscillator positioned within each of the different threshold voltage portions. Thus, the determination of the operating speed of each of the integrated circuit devices 402 includes determining across chip variations (ACV) of the delay parameters. Further, the determination of the operating speed of each of the integrated circuit devices 402 can be made: by examination of theoretical control paths (TCP); using a yield equation to find voltages that produce zero timing slack within each of the integrated circuit devices; using multiple controlling canonical slack equations that weigh performance against voltage to produce non-linear delay measures, etc.

This method also sorts the integrated circuit devices after manufacture into relatively slow integrated circuit devices and relatively fast integrated circuit devices based on the operating speed of each of the integrated circuit devices to classify the integrated circuit devices into different voltage bins in item 404. The relatively fast integrated circuit devices consume more power than the relatively slow integrated circuit devices and, therefore, operating voltages of the integrated circuit devices can be altered according to the voltage bins to optimize power usage. Thus, this method can embed voltage bin information in each of the integrated circuit devices based on which of the different voltage bins each of the integrated circuit devices has been classified in item 406. The voltage bin information can be used to control the operating voltage at which each of the integrated circuit devices are to be operated.

Figure 23:
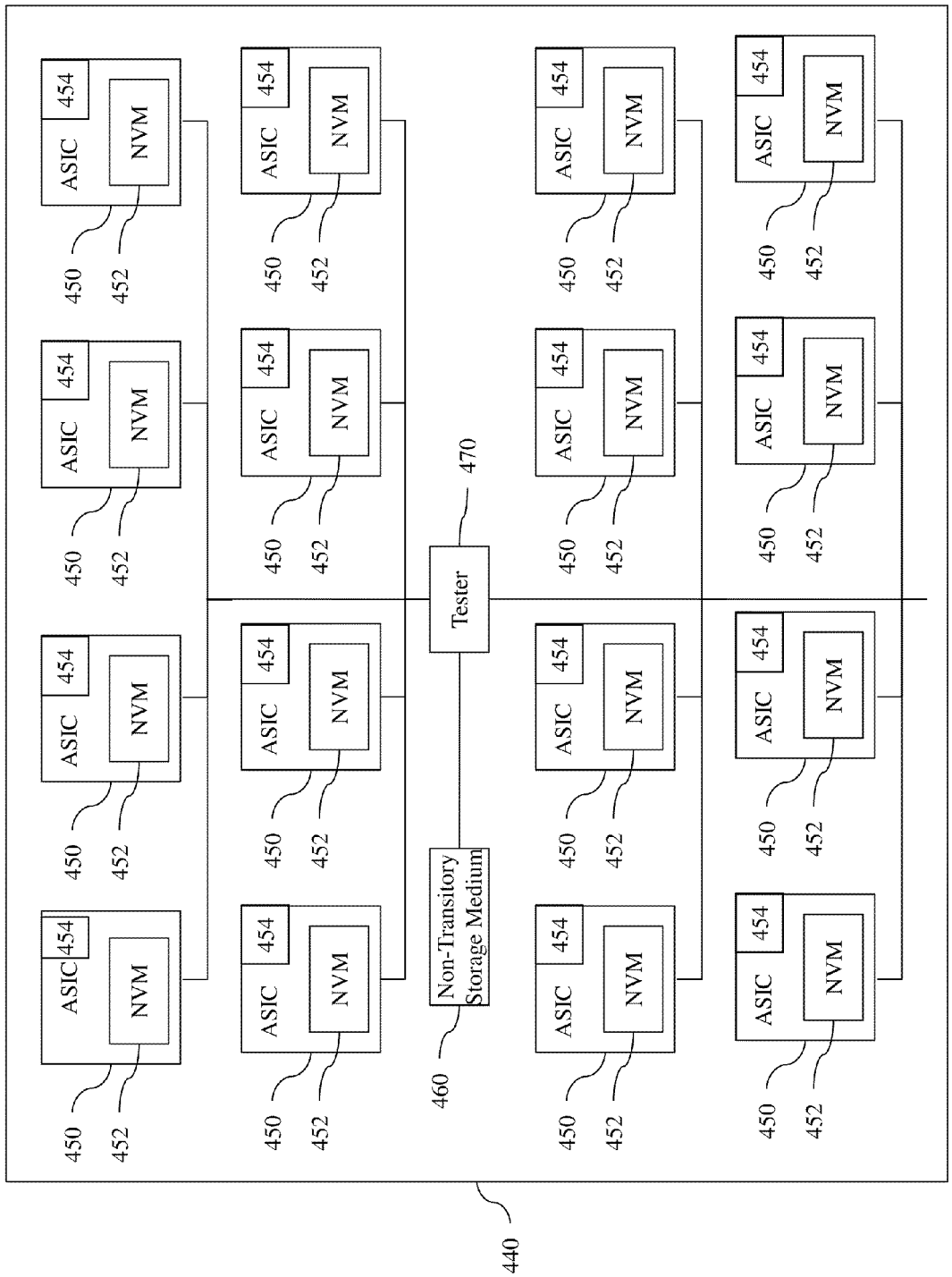
FIG. 23 is a schematic diagram illustrating circuits herein.

FIG. 23 illustrates an additional embodiment herein which is a device (support) 440 that comprises a plurality of digital circuits 450 manufactured from an identical circuit design, a power controller or tester 460 operatively connect to the digital circuits, and a non-transitory storage medium 452 operatively connected to the power controller/tester 460. In this example all the digital circuits 450 are application specific integrated circuits (ASIC); however, as would be understood by those ordinarily skilled in the art, any device could be used with the embodiments herein. As mentioned above, the digital circuits 450 are classified into different voltage bins. Each of the digital circuits 450 is tested to operate within a corresponding current leakage limit of a corresponding voltage bin into which each of the digital circuits has been classified. The non-transitory storage medium 452 stores boundaries of the voltage bins as speed-binning test data.

The speed-binning test data has been generated and stored in the non-transitory storage medium 452 during production testing of the digital circuits. The non-transitory storage medium 452 can comprise, for example, a programmable fuse block. The power controller/tester 460 determines a speed constraint for a task to be executed by a given digital circuit 450 based on a voltage bin to which the digital circuit has been classified, and the power controller/tester 460 also specifies levels of the power-supply signals for execution of the task based on such a speed constraint. Some embodiments can also include a sensor 454 that senses the temperature of a given digital circuit. Additional embodiments can also include a power management unit (PMU) 470 that receives instructions from the power controller/tester 460 regarding levels of the power-supply signals and generates the power-supply signals based on the instructions.

Thus, test device 460 can be operatively (directly or indirectly) connected to the integrated circuit devices through the support 440. Also, a non-transitory storage medium 452 can be operatively connected to the test device. The test device performs testing according to instructions stored in the non-transitory storage medium.

The instructions causing the test device to perform a method that determines an operating speed of each of the integrated circuit devices based on delay parameters applied to a canonical equation that evaluates different threshold voltage portions of each of the integrated circuit devices differently. Again, each of the different threshold voltage portions of the integrated circuit devices operating at different threshold voltages. The instructions further cause the test device to sort the integrated circuit devices after manufacture into relatively slow integrated circuit devices and relatively fast integrated circuit devices based on the operating speed of each of the integrated circuit devices, to classify the integrated circuit devices into different voltage bins. The relatively fast integrated circuit devices again consume more power than the relatively slow integrated circuit devices. The instructions also cause the test device to embed voltage bin information in the integrated circuit devices based on which of the different voltage bins each of the integrated circuit devices has been classified. The voltage bin information controls the operating voltage at which each of the integrated circuit devices are to be operated.

Figure 24:
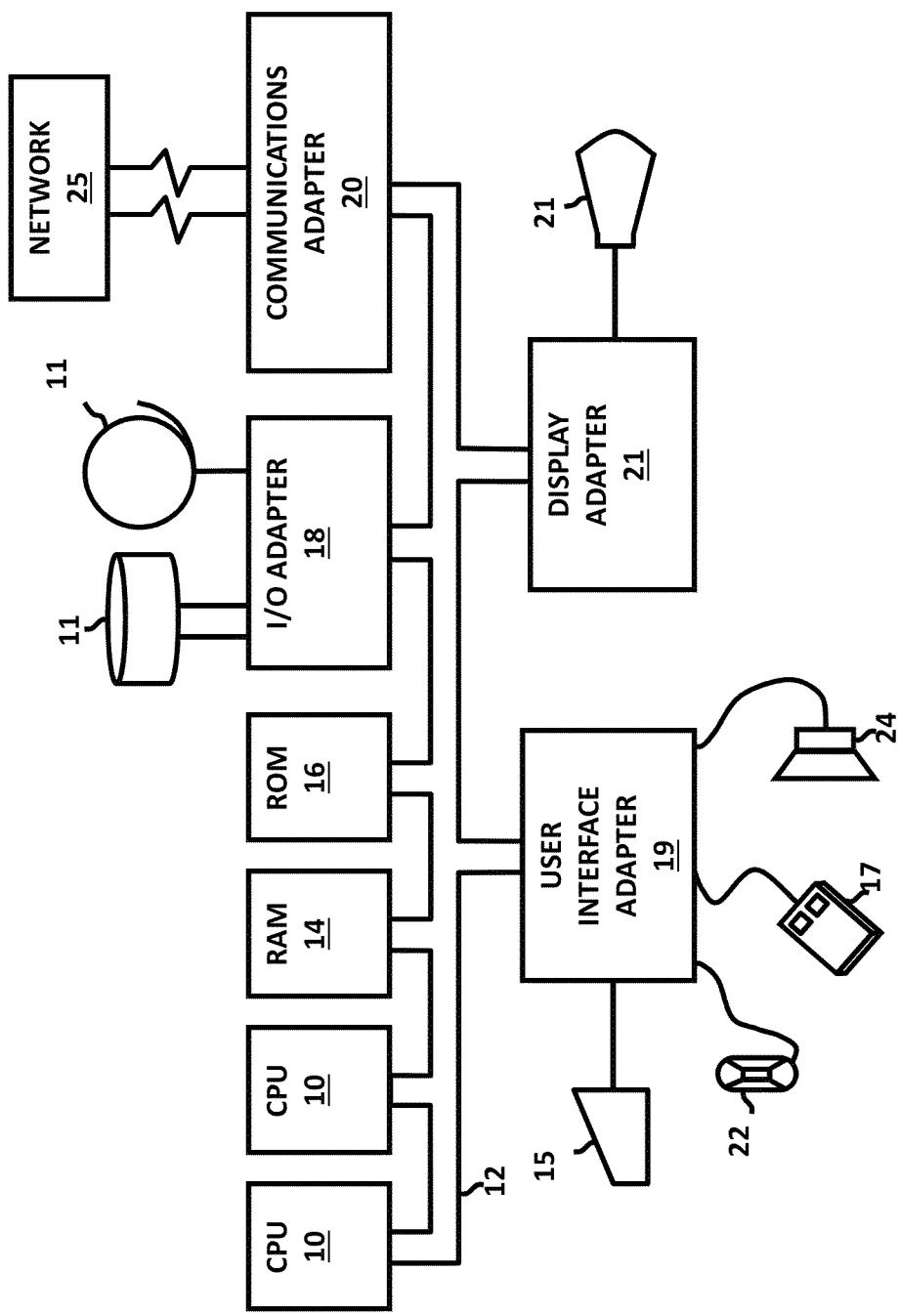
FIG. 24 is a schematic diagram of a hardware system according to embodiments herein.

A representative hardware environment for practicing the embodiments herein is depicted in FIG. 24. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of optimizing power usage in an integrated circuit design, said method comprising:
   manufacturing integrated circuit devices according to an integrated circuit design using manufacturing equipment, said integrated circuit design producing integrated circuit devices that are identically designed and perform at different operating speeds caused by manufacturing process variations;
   determining an operating speed of each of said integrated circuit devices based on delay parameters applied to a canonical equation that evaluates different threshold voltage portions of each of said integrated circuit devices differently, each of said different threshold voltage portions of said integrated circuit devices operating at different threshold voltages;
   sorting said integrated circuit devices after manufacture into relatively slow integrated circuit devices and relatively fast integrated circuit devices based on said operating speed of each of said integrated circuit devices to classify said integrated circuit devices into different voltage bins, said relatively fast integrated circuit devices consuming more power than said relatively slow integrated circuit devices; and
   embedding voltage bin information in said integrated circuit devices based on which of said different voltage bins each of said integrated circuit devices has been classified, said voltage bin information controlling an operating voltage at which each of said integrated circuit devices are to be operated.

2. The method of claim 1, said determining of said operating speed of each of said integrated circuit devices comprising using multiple controlling canonical slack equations that weigh performance against voltage to produce non-linear delay measures.

3. The method of claim 1, said determining of said operating speed of each of said integrated circuit devices comprising examination of theoretical control paths (TCP).

4. The method of claim 1, said determining of said operating speed of each of said integrated circuit devices comprising using a yield equation to find voltage that produce zero timing slack within each of said integrated circuit devices.

5. The method of claim 1, said determining of said operating speed of each of said integrated circuit devices comprising obtaining data from at least one ring oscillator positioned within each of said different threshold voltage portions.

6. The method of claim 1, said determining of said operating speed of each of said integrated circuit devices comprising determining across chip variations of said delay parameters.

7. A method of optimizing power usage in an integrated circuit design, said method comprising:
   manufacturing integrated circuit devices according to an integrated circuit design using manufacturing equipment, said integrated circuit design producing integrated circuit devices that are identically designed and perform at different operating speeds caused by manufacturing process variations;
   determining an operating speed of each of said integrated circuit devices based on delay parameters applied to a canonical equation that evaluates different threshold voltage portions of each of said integrated circuit devices differently, said canonical equation being customized for each of said integrated circuit devices based on ranges of said delay parameters, each of said different threshold voltage portions of said integrated circuit devices operating at different threshold voltages;
   sorting said integrated circuit devices after manufacture into relatively slow integrated circuit devices and relatively fast integrated circuit devices based on said operating speed of each of said integrated circuit devices to classify said integrated circuit devices into different voltage bins, said relatively fast integrated circuit devices consuming more power than said relatively slow integrated circuit devices; and
   embedding voltage bin information in said integrated circuit devices based on which of said different voltage bins each of said integrated circuit devices has been classified, said voltage bin information controlling an operating voltage at which each of said integrated circuit devices are to be operated.

8. The method of claim 7, said determining of said operating speed of each of said integrated circuit devices comprising using multiple controlling canonical slack equations that weigh performance against voltage to produce non-linear delay measures.

9. The method of claim 7, said determining of said operating speed of each of said integrated circuit devices comprising examination of theoretical control paths (TCP).

10. The method of claim 7, said determining of said operating speed of each of said integrated circuit devices comprising using a yield equation to find voltage that produce zero timing slack within each of said integrated circuit devices.

11. The method of claim 7, said determining of said operating speed of each of said integrated circuit devices comprising obtaining data from at least one ring oscillator positioned within each of said different threshold voltage portions.

12. The method of claim 7, said determining of said operating speed of each of said integrated circuit devices comprising determining across chip variations of said delay parameters.

13. A testing system comprising:
   a support having a plurality of integrated circuit devices mounted thereon, said integrated circuit devices being manufactured from an identical circuit design, and said integrated circuit devices performing at different operating speeds based on manufacturing process variations;
   a test device operatively connected to said integrated circuit devices through said support; and
   a non-transitory storage medium operatively connected to said test device,
   said test device performing testing according to instructions stored in said non-transitory storage medium, said instructions causing said test device to perform a method comprising:

determining an operating speed of each of said integrated circuit devices based on delay parameters applied to a canonical equation that evaluates different threshold voltage portions of each of said integrated circuit devices differently, each of said different threshold voltage portions of said integrated circuit devices operating at different threshold voltages;

sorting said integrated circuit devices after manufacture into relatively slow integrated circuit devices and relatively fast integrated circuit devices based on said operating speed of each of said integrated circuit devices to classify said integrated circuit devices into different voltage bins, said relatively fast integrated circuit devices consuming more power than said relatively slow integrated circuit devices; and embedding voltage bin information in said integrated circuit devices based on which of said different voltage bins each of said integrated circuit devices has been classified, said voltage bin information controlling an operating voltage at which each of said integrated circuit devices are to be operated.

14. The testing system of claim 13, said determining of said operating speed of each of said integrated circuit devices comprising using multiple controlling canonical slack equations that weigh performance against voltage to produce non-linear delay measures.

15. The testing system of claim 13, said determining of said operating speed of each of said integrated circuit devices comprising examination of theoretical control paths (TCP).

16. The testing system of claim 13, said determining of said operating speed of each of said integrated circuit devices comprising using a yield equation to find voltage that produce zero timing slack within each of said integrated circuit devices.

17. The testing system of claim 13, said determining of said operating speed of each of said integrated circuit devices comprising obtaining data from at least one ring oscillator positioned within each of said different threshold voltage portions.

18. The testing system of claim 13, said determining of said operating speed of each of said integrated circuit devices comprising determining across chip variations of said delay parameters.

19. A non-transitory computer storage medium storing instructions and being readable by a computerized device, said instructions causing said computerized device to perform a method comprising:

receiving manufactured integrated circuit devices, said integrated circuit devices being manufactured according to an integrated circuit design using manufacturing equipment, said integrated circuit design producing integrated circuit devices that are identically designed and perform at different operating speeds caused by manufacturing process variations;

determining an operating speed of each of said integrated circuit devices based on delay parameters applied to a canonical equation that evaluates different threshold voltage portions of each of said integrated circuit devices differently, each of said different threshold voltage portions of said integrated circuit devices operating at different threshold voltages;

sorting said integrated circuit devices after manufacture into relatively slow integrated circuit devices and relatively fast integrated circuit devices based on said operating speed of each of said integrated circuit devices to classify said integrated circuit devices into different voltage bins, said relatively fast integrated circuit devices consuming more power than said relatively slow integrated circuit devices; and embedding voltage bin information in said integrated circuit devices based on which of said different voltage bins each of said integrated circuit devices has been classified, said voltage bin information controlling an operating voltage at which each of said integrated circuit devices are to be operated.

20. The non-transitory computer storage medium of claim 19, said determining of said operating speed of each of said integrated circuit devices comprising using multiple controlling canonical slack equations that weigh performance against voltage to produce non-linear delay measures.

21. The non-transitory computer storage medium of claim 19, said determining of said operating speed of each of said integrated circuit devices comprising examination of theoretical control paths (TCP).

22. The non-transitory computer storage medium of claim 19, said determining of said operating speed of each of said integrated circuit devices comprising using a yield equation to find voltage that produce zero timing slack within each of said integrated circuit devices.

23. The non-transitory computer storage medium of claim 19, said determining of said operating speed of each of said integrated circuit devices comprising obtaining data from at least one ring oscillator positioned within each of said different threshold voltage portions.

24. The non-transitory computer storage medium of claim 19, said determining of said operating speed of each of said integrated circuit devices comprising determining across chip variations of said delay parameters.

* * * * *